(12) United States Patent
Arima et al.

(10) Patent No.: US 11,703,550 B2
(45) Date of Patent: *Jul. 18, 2023

(54) RESONANCE VOLTAGE ATTENUATION DETECTION CIRCUIT, SEMICONDUCTOR DEVICE FOR SWITCHING POWER, AND SWITCHING POWER SUPPLY

(71) Applicants: Satoshi Arima, Isehara (JP); Hiroki Matsuda, Zama (JP)

(72) Inventors: Satoshi Arima, Isehara (JP); Hiroki Matsuda, Zama (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 344 days.

This patent is subject to a terminal disclaimer.

(21) Appl. No.: 17/117,243

(22) Filed: Dec. 10, 2020

(65) Prior Publication Data

US 2021/0199728 A1 Jul. 1, 2021

(30) Foreign Application Priority Data

Dec. 25, 2019 (JP) ................................. 2019-235114

(51) Int. Cl.
| | |
|---|---|
| *G01R 31/62* | (2020.01) |
| *G01R 19/165* | (2006.01) |
| *G01R 31/14* | (2006.01) |
| *G01R 1/20* | (2006.01) |

(52) U.S. Cl.
CPC ............. *G01R 31/62* (2020.01); *G01R 1/20* (2013.01); *G01R 19/16566* (2013.01); *G01R 31/14* (2013.01)

(58) Field of Classification Search
None
See application file for complete search history.

(56) References Cited

U.S. PATENT DOCUMENTS

| | | | |
|---|---|---|---|
| 7,492,615 B2 | 2/2009 | Morota et al. | |
| 8,305,775 B2 | 11/2012 | Shimada | |
| 8,587,966 B2 | 11/2013 | Shimada | |
| 9,030,131 B2 | 5/2015 | Kado et al. | |
| 9,601,983 B2 | 3/2017 | Chang et al. | |

(Continued)

FOREIGN PATENT DOCUMENTS

| | | |
|---|---|---|
| CN | 1109662 A | * 10/1995 |
| JP | 2011078240 A | 4/2011 |

(Continued)

*Primary Examiner* — Patrick Assouad
*Assistant Examiner* — Haidong Zhang
(74) *Attorney, Agent, or Firm* — Holtz, Holtz & Volek PC

(57) ABSTRACT

A resonance voltage attenuation detection circuit detects attenuation of a resonance voltage of a winding of a transformer. The resonance voltage attenuation detection circuit includes a first voltage comparator circuit and a time-out circuit. The first voltage comparator circuit compares a voltage of the winding with a predetermined first voltage. The time-out circuit performs clocking operation in accordance with an output of the first voltage comparator circuit. The time-out circuit outputs an attenuation detection signal when the time-out circuit has clocked a preset period which is shorter than a time required for a peak voltage of the winding to be attenuated from the first voltage to a predetermined second voltage lower than the first voltage.

12 Claims, 20 Drawing Sheets

(56) References Cited

U.S. PATENT DOCUMENTS

| | | |
|---|---|---|
| 9,627,977 B2 | 4/2017 | Sonobe |
| 9,960,690 B2 | 5/2018 | Matsuda |
| 10,128,762 B2 | 11/2018 | Matsuda et al. |
| 10,170,906 B2 | 1/2019 | Matsuda et al. |
| 10,284,071 B2 | 5/2019 | Matsuda et al. |
| 10,491,128 B2 | 11/2019 | Arima et al. |
| 10,720,847 B2 | 7/2020 | Matsuda et al. |
| 10,819,219 B2 | 10/2020 | Matsuda et al. |
| 2009/0296437 A1 | 12/2009 | Li et al. |
| 2011/0096574 A1 | 4/2011 | Huang |
| 2014/0177286 A1 | 6/2014 | Sonobe |
| 2016/0261199 A1 | 9/2016 | Adragna et al. |
| 2016/0329814 A1 | 11/2016 | Fahlenkamp et al. |
| 2018/0034373 A1 | 2/2018 | Matsuda et al. |
| 2018/0191255 A1 | 7/2018 | Mizoe et al. |
| 2018/0262096 A1 | 9/2018 | Hsu et al. |
| 2019/0074761 A1 | 3/2019 | Matsuda |
| 2020/0112264 A1 | 4/2020 | Arima et al. |
| 2020/0127571 A1 | 4/2020 | Matsuda et al. |

FOREIGN PATENT DOCUMENTS

| | | |
|---|---|---|
| JP | 2014124038 A | 7/2014 |
| JP | 2020058196 A | 4/2020 |

* cited by examiner

FIRST EMBODIMENT

SECOND EMBODIMENT

ON-CURRENT PEAK AGAINST LOAD CURRENT

SWITCHING FREQUENCY AGAINST LOAD CURRENT

RESONANCE VOLTAGE ATTENUATION DETECTION CIRCUIT, SEMICONDUCTOR DEVICE FOR SWITCHING POWER, AND SWITCHING POWER SUPPLY

CROSS REFERENCE TO RELATED APPLICATION

This application is based upon and claims the benefit of priority under 35 USC 119 of Japanese Patent Application No. 2019-235114 filed on Dec. 25, 2019, the entire disclosure of which, including the description, claims, drawings and abstract, is incorporated herein by reference in its entirety.

BACKGROUND OF THE INVENTION

1. Field of the Invention

The present invention relates to a resonance voltage attenuation detection circuit, a semiconductor device for a switching power (power control IC), and a switching power supply which detect attenuation of resonance occurring in a winding through which a current flows intermittently.

The present invention particularly relates to:

a power control IC that controls a switching element on a primary side of a DC power supply with a voltage conversion transformer;

a resonance voltage attenuation detection circuit in the power control IC; and a switching power supply to which the power control IC is applied.

2. Description of Related Art

An insulated switching power supply is one of DC power supplies and includes:

a diode-bridge circuit that rectifies an AC power supply; and a DC-DC converter which converts a DC voltage rectified by the diode-bridge circuit into a desired DC voltage.

As an example of the insulated switching power supply, a known switching power supply controls a current flowing through a primary winding of the voltage conversion transformer by turning on and off a switching element connected in series with the primary winding in the PWM (pulse-width modulation) control method, the quasi-resonance control method or the like to control a voltage induced in a secondary winding.

Some conventional switching power supplies that adopt the PWM control method switch between the PWM control method and the PFM (pulse frequency modulation) control method. On the other hand, for example, JP 2014-124038A and U.S. Pat. No. 9,601,983 disclose inventions related to conventional switching power supplies that adopt the quasi-resonance control method. As disclosed therein, conventional switching power supplies that adopt the quasi-resonance control method are configured to operate only in the quasi-resonance control mode.

The PWM control and the quasi-resonance control both have advantages and disadvantages. For example, the PWM control has disadvantages of large switching loss, large switching noise and slightly poor power efficiency. However, the PWM control has small sound noise. Further, operation in a continuous current mode is possible. A current peak of a transformer is lowered, and therefore the transformer is miniaturized. It is advantageous. On the other hand, the quasi-resonance control makes sound noise due to bottom skip and can only be operated in a discontinuous current mode. Therefore, the quasi-resonance control has a disadvantage that a transformer, an output capacitor and other parts need to be larger. However, the quasi-resonance control has advantages of small switching loss, small switching noise and good power efficiency since the quasi-resonance control performs soft switching (soft turn-on) of turning on a device when a zero-current resonance voltage is at a bottom.

In one invention of a switching power supply, the PWM control is performed during a soft start period of activating a power supply (JP 2011-78240A). After the soft start period ends, the control is switched to the quasi-resonance control in a frequency control method. It eliminates an audible oscillator frequency.

However, there is a need for a switching power supply in which a control IC (semiconductor device) on a primary side switches between the PWM control and the quasi-resonance control during normal operation after the power supply is turned on.

Such a switching power supply has advantages of both control methods.

In view of this, the Applicant has filed an application of inventions of a switching power supply and a semiconductor device for a switching power (Japanese Patent Application No. 2018-188861). They have a transformer having an auxiliary winding and monitor a voltage (including a divided voltage) induced in the auxiliary winding. The PWM control and the quasi-resonance control are switched during normal operation after the device is turned on. It miniaturizes a transformer and other parts to realize a smaller power supply.

Thereafter, the inventors studied the semiconductor device and the switching power supply of the previous application. The invention of the previous application brings a desired effect when applied to a power supply in which an output voltage is constant without any change. However, in a case in which the invention of the previous application is applied to a power supply with a function of switching an output voltage (e.g., 5V and 20V) as specified, for example, in the USB-PD standard, the voltage induced in the auxiliary winding of the transformer is reduced on average when the output voltage is switched to a low voltage (e.g., 5V).

It occasionally reduces an amplitude of resonance in the auxiliary winding. It sometimes makes the circuit operate in an edge condition where the amplitude of resonance is sometimes detected and sometimes not detected under a predetermined threshold voltage. In that case, two cases coexist. In the first case, amplitude of resonance is detected, and a switching element on a side of a primary winding is turned off. In the second case, the amplitude of resonance is not detected, and the switching element is turned off on a cycle of a timer. It brings problems such as a larger ripple of the output voltage due to large fluctuation of a switching cycle, and generation of sound noise.

SUMMARY OF THE INVENTION

It is an object of the present invention to provide a resonance voltage attenuation detection circuit that detects attenuation of resonance occurring in a winding through which a current flows intermittently.

Another object of the present invention is to provide a switching power supply and a semiconductor device for a switching power that have small switching loss, small switching noise and good power efficiency.

Still another object of the present invention is to provide a switching power supply and a semiconductor device for a switching power that prevent large fluctuation of a switching cycle and generation of sound noise even in a case where an output voltage is switched and amplitude of resonance is reduced to bring an edge condition in which the amplitude of resonance is sometimes detected and sometimes not detected under a predetermined threshold voltage.

Still another object of the present invention is to provide a switching power supply and a semiconductor device for a switching power which switch between the PWM control and the quasi-resonance control during normal operation after the device is turned on. It increases average power efficiency and miniaturizes a transformer and other parts to realize a smaller power supply.

To achieve at least one of the abovementioned objects, according to the first aspect of the present invention, a resonance voltage attenuation detection circuit detects attenuation of a resonance voltage of a winding of a transformer, the resonance voltage attenuation detection circuit including:

a first voltage comparator circuit that compares a voltage of the winding with a predetermined first voltage; and a time-out circuit that performs clocking operation in accordance with an output of the first voltage comparator circuit, wherein the time-out circuit outputs an attenuation detection signal when the time-out circuit has clocked a preset period which is shorter than a time required for a peak voltage of the winding to be attenuated from the first voltage to a predetermined second voltage lower than the first voltage.

The resonance voltage attenuation detection circuit having the above configuration reliably detects attenuation of resonance occurring in a winding through which a current flows intermittently.

Preferably, the time-out circuit includes:

a constant current source;

a capacitance element that is charged by a current of the constant current source;

a switch that discharges a charge of the capacitance element; and a second voltage comparator circuit that compares a voltage of the capacitance element with a predetermined voltage, the switch is turned on and off by the output of the first voltage comparator circuit, and the time-out circuit outputs an output signal of the second voltage comparator circuit as the attenuation detection signal.

According to the above configuration, the clocking period of the time-out circuit is freely set by adjusting a current value of the constant current source and a capacitance value of the capacitance element.

According to the second aspect of the present invention, a semiconductor device for a switching power generates a drive signal that turns on and off a switching element connected in series with a primary winding of a transformer for voltage conversion which includes an auxiliary winding, the semiconductor device including:

a resonance voltage attenuation detection circuit to which a voltage induced in the auxiliary winding is applied and which detects attenuation of a resonance voltage;

a turn-on control circuit that generates a timing signal that turns on the switching element based on an attenuation detection signal output by the resonance voltage attenuation detection circuit; and a turn-off control circuit that generates a timing signal that turns off the switching element, wherein the semiconductor device is able to be operated in a quasi-resonance mode.

The semiconductor device having the above configuration realizes a DC power supply that has small switching loss, small switching noise and good power efficiency.

Preferably, the resonance voltage attenuation detection circuit includes:

a voltage comparator circuit that compares the voltage of the auxiliary winding with a predetermined first voltage; and a time-out circuit that performs clocking operation in accordance with an output of the voltage comparator circuit, the time-out circuit starts the clocking operation at a time point at which the voltage comparator circuit detects that a peak voltage of the auxiliary winding becomes lower than the first voltage, and the time-out circuit outputs an attenuation detection signal in a case in which a time required for the voltage of the auxiliary winding to fall from the first voltage to a predetermined second voltage lower than the first voltage is longer than a cycle of the resonance voltage and is shorter than a predetermined period.

According to the above configuration, the resonance voltage attenuation configuration circuit reliably detects attenuation of resonance occurring in the winding through which a current flows intermittently so that the switching element is turned on at an appropriate time point.

According to the third aspect of the present invention, a semiconductor device for a switching power generates a drive signal that turns on and off a switching element connected in series with a primary winding of a transformer for voltage conversion which includes an auxiliary winding, the semiconductor device including:

a first external terminal to which a feedback voltage corresponding to a voltage output from a secondary side of the transformer is applied;

a second external terminal to which a voltage induced in the auxiliary winding is applied;

a resonance detection circuit that detects resonance of the voltage of the auxiliary winding based on a voltage of the second external terminal;

a resonance voltage attenuation detection circuit that detects attenuation of a resonance voltage of the auxiliary winding based on the voltage of the second external terminal;

a turn-on control circuit that generates a timing signal that turns on the switching element based on a detection signal of the resonance detection circuit and on a detection signal of the resonance voltage attenuation detection circuit;

a turn-off control circuit that generates a timing signal that turns off the switching element based on a voltage of the first external terminal and a voltage proportional to a current flowing through the switching element; and a drive pulse generation circuit that generates a pulse signal which is a source of the drive signal based on the signal output from the turn-on control circuit and on the signal output from the turn-off control circuit, wherein the turn-on control circuit generates a timing signal that turns on the switching element when resonance of the voltage of the auxiliary winding is around a bottom so that the semiconductor device is able to be operated in a quasi-resonance mode.

The semiconductor device having the above configuration realizes a DC power supply that has small switching loss, small switching noise and good power efficiency.

Preferably, the semiconductor device further includes:
a timer circuit that clocks a period corresponding to the voltage of the first external terminal,
wherein
the turn-on control circuit generates a timing signal that turns on the switching element based on the detection signal of the resonance detection circuit, the detection signal of the resonance voltage attenuation detection circuit, and an output signal of the timer circuit, and
the turn-on control circuit controls the drive pulse generation circuit such that:
in a case in which the resonance voltage attenuation detection circuit does not detect attenuation of the resonance voltage, the pulse signal rises at a time point at which the resonance detection circuit outputs the detection signal after an output of the timer circuit changes; and
in a case in which the resonance voltage attenuation detection circuit detects attenuation of the resonance voltage, the pulse signal rises at a time point at which the output of the timer circuit changes.

According to the above configuration, when attenuation of a resonance voltage is not detected, the switching element is turned on in the quasi-resonance mode. When attenuation of a resonance voltage is detected, the switching element is turned on in the PWM mode. It increases average power efficiency and miniaturizes the transformer and other parts to realize a smaller power supply.

Preferably, the resonance detection circuit includes a first voltage comparator circuit that compares the voltage of the second external terminal with a predetermined first voltage,
the resonance detection circuit outputs a resonance detection signal in a case in which the voltage of the second external terminal becomes lower than the first voltage,
the resonant voltage attenuation circuit comprises:
a second voltage comparator circuit that compares the voltage of the second external terminal with a predetermined second voltage higher than the first voltage; and
a clocking circuit that clocks a predetermined period shorter than a clocking period of the timer circuit,
the clocking circuit begins clocking operation at a time point at which the second voltage comparator circuit detects that a peak voltage of the second external terminal becomes lower than the second voltage,
the clocking circuit outputs an attenuation detection signal in a case in which a time required for the voltage of the second external terminal to fall from the second voltage to the first voltage is longer than a cycle of the resonance voltage and is shorter than a predetermined period expected in advance to be required for attenuation, and
the turn-on control circuit controls the drive pulse generation circuit such that the pulse signal rises at a time point at which the timer circuit has clocked a predetermined clocking period in a case in which the attenuation detection signal is output before the timer circuit clocks a predetermined clocking period.

According to the above configuration, the switching cycle does not fluctuate greatly even in an edge condition where amplitude of resonance is small and is sometimes detected and sometimes not detected under a predetermined threshold voltage. It prevents a large ripple of the output voltage and sound noise. Also, in a case in which a zero-current resonance period is relatively long, attenuation of the resonance voltage of the auxiliary winding is detected, and the switching element is turned on at an appropriate time point.

Preferably, the resonant voltage attenuation circuit includes:
a delay circuit that delays a signal output from the drive pulse generation circuit; and
a logic circuit that prevents a detection signal from being supplied to the clocking circuit, the detection signal being output from the second voltage comparator circuit based on an output signal of the delay circuit.

Similarly, the resonance detection circuit may include:
a delay circuit that delays a signal output from the drive pulse generation circuit; and
a logic circuit that temporarily prevents a detection signal from being output from the first voltage comparator circuit based on an output signal of the delay circuit.

The above configuration prevents unintentional operations, such as false detection of the resonance detection circuit due to occurrence of ringing immediately after rise of the voltage of the auxiliary winding (drain voltage of the switching element).

Preferably, the delay circuit delays a signal obtained by inverting the signal output from the drive pulse generation circuit, and
the resonant voltage attenuation circuit includes:
a latch circuit that receives the output signal of the delay circuit when the detection signal output from the second voltage comparator circuit falls; and
a logic circuit that logically adds the output signal of the clocking circuit to an output signal of the latch circuit.

The above configuration allows operation in a continuous current mode in more conditions. It miniaturizes the transformer and other parts, and reduces the cost.

Preferably, the period clocked by the timer circuit is set in accordance with the voltage of the first external terminal such that:
the period is set at a longer time in a first case in which the voltage of the first external terminal is low, and
the period is set at a shorter time in a second case in which the voltage of the first external terminal is high.

According to the above configuration, the period clocked by the timer circuit is longer in the first case in which the voltage of the first external terminal (FB) is low, and the period is shorter in the second case in which the voltage of the first external terminal is high. During normal operation after the device is turned on, the PWM control and the quasi-resonance control are switched. It increases average power efficiency and miniaturizes the transformer and other parts to realize a smaller power supply.

According to the fourth aspect of the present invention, a switching power supply includes:
the semiconductor device having the above configuration;
a transformer which comprises an auxiliary winding and a primary winding to which a voltage obtained by rectifying an AC voltage is applied; and
a switching element connected to the primary winding, wherein
the semiconductor device controls the switching element to output a predetermined voltage to a side of a secondary winding, and
an output voltage on the side of the secondary winding is switched based on an external signal.

According to the above configuration, a magnitude of the output voltage of the switching power supply is switched to prevent a large ripple of the output voltage and sound noise.

The present invention provides a resonance voltage attenuation detection circuit that detects attenuation of resonance occurring in a winding through which a current flows intermittently. The present invention also provides a switching power supply and a semiconductor device for a switching power with small switching loss, small switching noise and good power efficiency.

The present invention realizes a switching power supply and a semiconductor device for a switching power in which an output voltage is switched so that a switching cycle does not fluctuate largely even in a case in which amplitude of resonance becomes smaller to bring an edge condition where the amplitude of resonance is sometimes detected and sometimes not detected under a predetermined threshold voltage. It prevents a large ripple of the output voltage and sound noise.

The PWM control and the quasi-resonance control are switched during normal operation after the device is turned on. It brings advantageous effect of realizing a switching power supply and a semiconductor device for a switching power which have high average power efficiency and small parts including a transformer to realize a smaller power supply.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF THE PREFERRED EMBODIMENT

Preferred embodiments of the present invention will be described with reference to the drawings.

Figure 1:
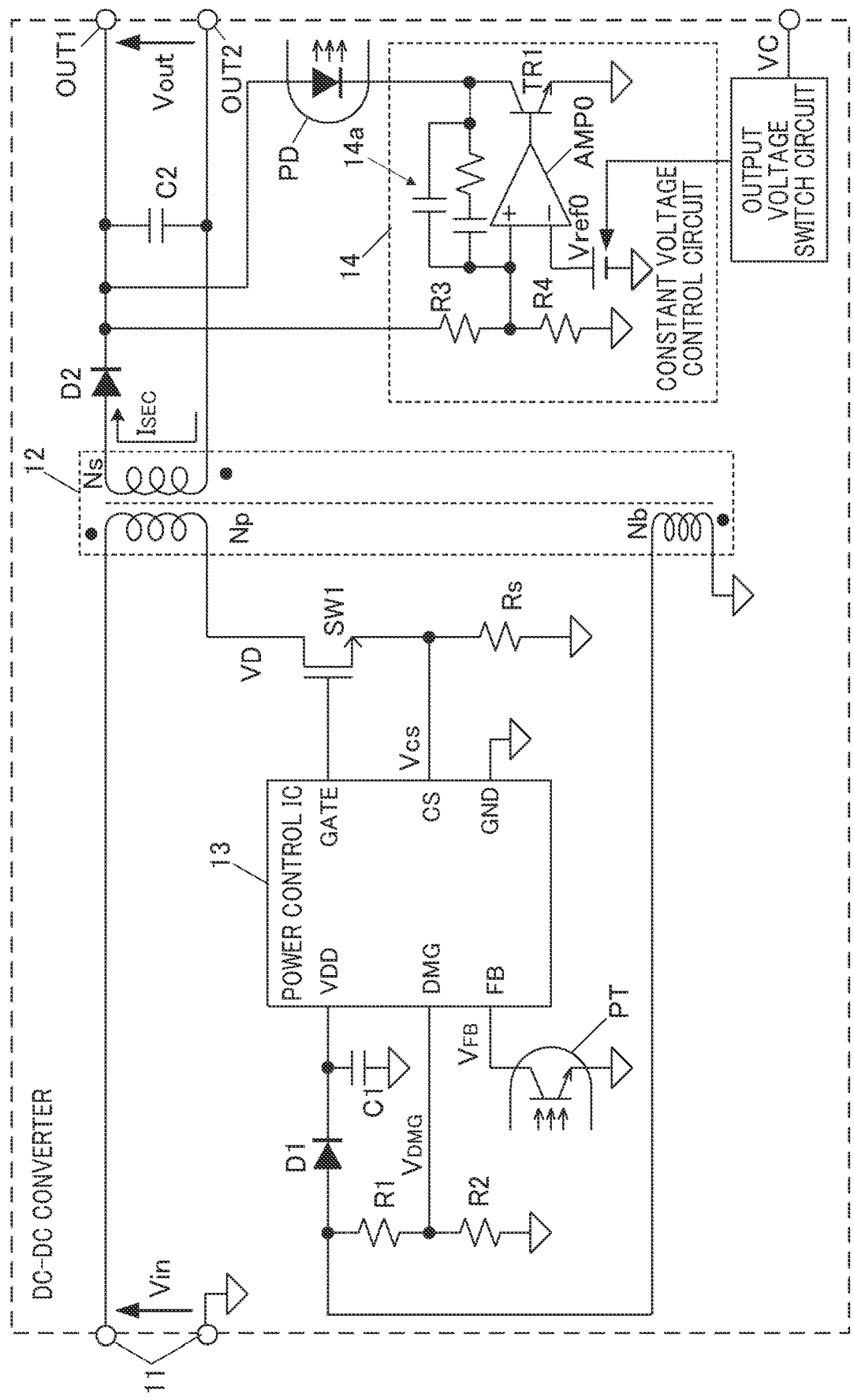
FIG. 1 is a circuit diagram showing an embodiment of a DC-DC converter as a DC power supply to which a semiconductor device for a switching power according to the present invention is applied.

FIG. 1 is a circuit configuration diagram showing an embodiment of a DC-DC converter as a DC power supply to which a semiconductor device for a switching power according to the present invention is applied.

The DC-DC converter of the embodiment includes:

a pair of voltage input terminals 11 to which DC voltages are input;

a transformer 12 for voltage conversion which includes a primary winding Np, a secondary winding Ns and an auxiliary winding Nb;

a switching transistor SW1 connected in series with the primary winding Np of the transformer 12; and a semiconductor device for a switching power (hereinafter, referred to as a power control IC) 13 which turns on and off the switching transistor SW1.

In a case in which the invention constitutes a switching power supply, a diode bridge circuit and a smoothing capacitor which rectify an AC voltage from an AC power supply are connected in front of the input terminal 11.

In the embodiment, the switching transistor SW1 is an N-channel MOSFET (insulated gate field-effect transistor) which is a discrete component. The power control IC 13 is provided with an output terminal GATE which outputs a gate drive signal that drives a gate of the transistor SW1.

In the DC-DC converter of the embodiment, a rectifier smoothing circuit is provided on a primary side of the transformer 12.

The rectifier smoothing circuit includes:

a rectifier diode D1 connected in series with the auxiliary winding Nb; and a smoothing capacitor C1 connected between a cathode terminal of the diode D1 and a ground point GND.

The voltage rectified and smoothed by the rectifier smoothing circuit is applied to a power supply voltage terminal VDD of the power control IC 13. The power control IC 13 is provided with an external terminal DMG to which a voltage VDMG is applied. The voltage VDMG is obtained by dividing a voltage induced in the auxiliary winding Nb with resistors R1, R2.

The power control IC 13 is provided with an external terminal FB to which a phototransistor (light receiving element) PT is connected. The phototransistor PT constitutes a photocoupler that transmits an output detection signal on a secondary side to the primary side as a feedback voltage VFB.

A resistor Rs for current detection is connected between a source terminal of the switching transistor SW1 and the ground point GND, and performs current-voltage conversion to obtain a voltage Vcs. The power control IC 13 is provided with an external terminal CS as a current detection terminal to which the voltage Vcs is applied.

On the secondary side of the transformer 12, the DC-DC converter includes:

a rectifying diode D2 connected in series with the secondary winding Ns; and a smoothing capacitor C2 connected between a cathode terminal of the diode D2 and the other terminal of the secondary winding Ns.

An AC voltage induced in the secondary winding Ns is rectified and smoothed by intermittently passing a current through the primary winding Np. Thus a DC voltage Vout is generated and output.

On the secondary side of the transformer 12, the DC-DC converter further includes:

a constant voltage control circuit (shunt regulator) 14 that constitutes an output voltage detection circuit which detects the output voltage Vout; and a photodiode (light emitting element) PD that constitutes a photocoupler which transmits an output voltage detection signal to the primary side, the output voltage detection signal corresponding to a voltage detected by the constant voltage control circuit 14.

The constant voltage control circuit 14 sends a current corresponding to the detected voltage to the photodiode PD. The photodiode PD transmits an optical signal to the primary side, the optical signal having an intensity corresponding to the detected voltage. Thus, a current corresponding to the light intensity flows through the phototransistor PT. A pull-up resistor (Rp in FIG. 2) and the like in the power control IC 13 convert the current into a voltage VFB. This voltage VFB is input.

The constant voltage control circuit 14 includes:

a bipolar transistor TR1 connected in series with the photodiode PD;

resistors R3, R4 that divide the output voltage Vout on the secondary side;

an error amplifier AMP0 that compares the divided voltage with a reference voltage Vref0 to output a voltage in accordance with a potential difference; and a phase compensation circuit 14a.

The output voltage of the error amplifier AMP0 is applied to the base terminal of the transistor TR1, and a current corresponding to the output voltage Vout flows. In the embodiment, the higher the output voltage Vout on the secondary side, the larger the current flowing through the photodiode PD and through the phototransistor PT, and the lower the voltage VFB of the external terminal FB in the power control IC 13.

The embodiment includes an output voltage switch circuit 15 that supplies a switch signal to the constant voltage control circuit 14 in response to an output voltage switch signal VC from a load device. A switch signal from the output voltage switch circuit 15 switches, for example, the reference voltage Vref0 to switch the output voltage Vout between, for example, 5V and 20V. Then the result is output. The present invention is not limited to this. The rectifying diode D2 in the circuit on the secondary side may be replaced with a switch to adopt the synchronous rectification method.

First Embodiment

Configuration of function blocks and functions of the blocks in the first embodiment of the power control IC 13 on the primary side of the power supply in FIG. 1 will be described with reference to FIG. 2 to FIG. 11.

Figure 2:
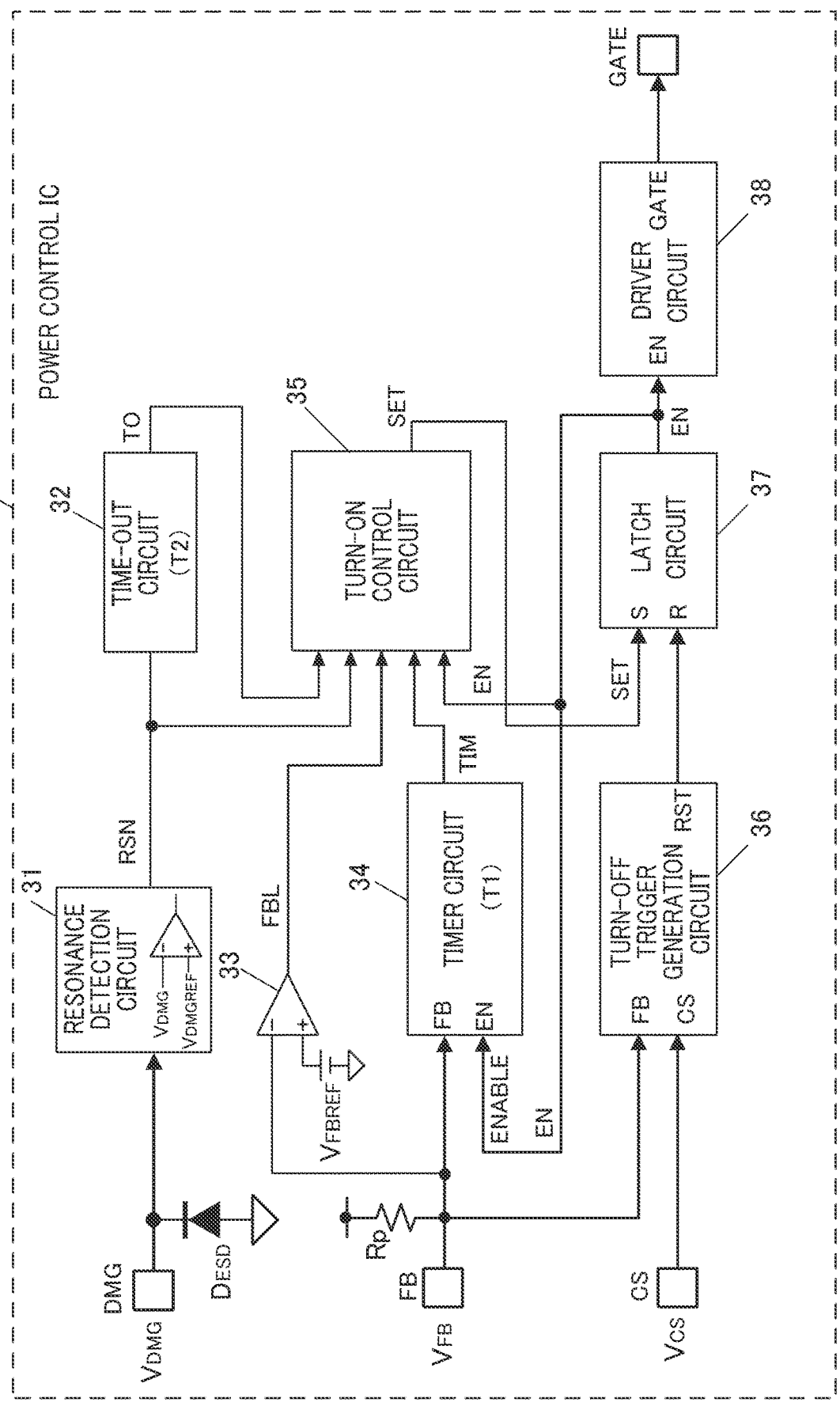
FIG. 2 is a functional block diagram showing a first embodiment of the semiconductor device according to the present invention provided on a primary side of a transformer in the DC-DC converter in FIG. 1.

As shown in FIG. 2, the power-control IC 13 of the embodiment includes:

a resonance detection circuit 31 having a comparator (voltage comparator circuit) that monitors the voltage VDMG of the external terminal DMG to detect resonance;

a time-out circuit 32 that begins clocking in response to detection of resonance and raises an output signal after clocking a predetermined period T2;

an FB comparator 33 that compares the voltage VFB of the external terminal FB with a predetermined reference voltage VFBREF to determine whether VFB is equal to or less than VFBREF; and a timer circuit 34 that generates a switching cycle of the switching element SW1 by clocking a period corresponding to the voltage VFB of the external terminal FB.

The time-out circuit 32 is provided to forcibly turn on the switching element SW1 upon clocking the predetermined period T2 in a case in which the resonance detection circuit 31 ceases to detect resonance before the timer circuit 34 clocks a predetermined period T1.

The power control IC 13 includes:

a turn-on control circuit 35 to which output signals of the resonance detection circuit 31, the time-out circuit 32, the FB comparator 33 and the timer circuit 34 are input and which generates a timing signal that turns on the switching element SW1;

a turn-off trigger generation circuit 36 to which the voltage VFB of the external terminal FB and the voltage Vcs of the external terminal CS are applied and which generates a timing signal that turns off SW1;

a latch circuit 37 that includes an RS flip-flop to which an output of a turn-on control circuit 35 and an output of a turn-off trigger generation circuit 36 are input; and a driver circuit 38 which generates a gate drive signal that drives the switching element SW1 in response to an output EN of the latch circuit 37 and which outputs the gate drive signal from an external terminal GATE.

The output EN of the latch circuit 37 is input to the timer circuit 34 as a signal that enables the timer circuit 34, and is input to the turn-on control circuit 35 as a signal that resets the turn-on control circuit 35. Hereinafter, specific examples and operation of the functional blocks will be described.

Among the functional blocks 31 to 38 constituting the power control IC 13, the resonance detection circuit 31 is constituted by a comparator (voltage comparator circuit) that compares, for example, the voltage VDMG of the external terminal DMG with a predetermined reference voltage VDMGREF. When VDMG exceeds VDMGREF, output of the comparator changes to a low level (or a high level).

The resonance detection circuit 31 is provided to detect a time point at which the switching element SW1 is turned on in the quasi-resonance mode. Therefore, the resonance detection circuit 31 is preferably configured to detect a portion around a bottom (circled portion) of resonance of a drain voltage VD of the switching element SW1 in FIG. 3A. However, the drain voltage VD of SW1 occasionally exceeds 500V depending on specifications of the power supply. Dividing the drain voltage VD results in larger loss and larger parts. Further, since the center value of a resonance voltage depends on an input voltage, it is difficult to set a reference in the semiconductor device. Thus it is difficult for the semiconductor device to detect a bottom from the drain voltage VD.

Figures 3A, 3B, 4:
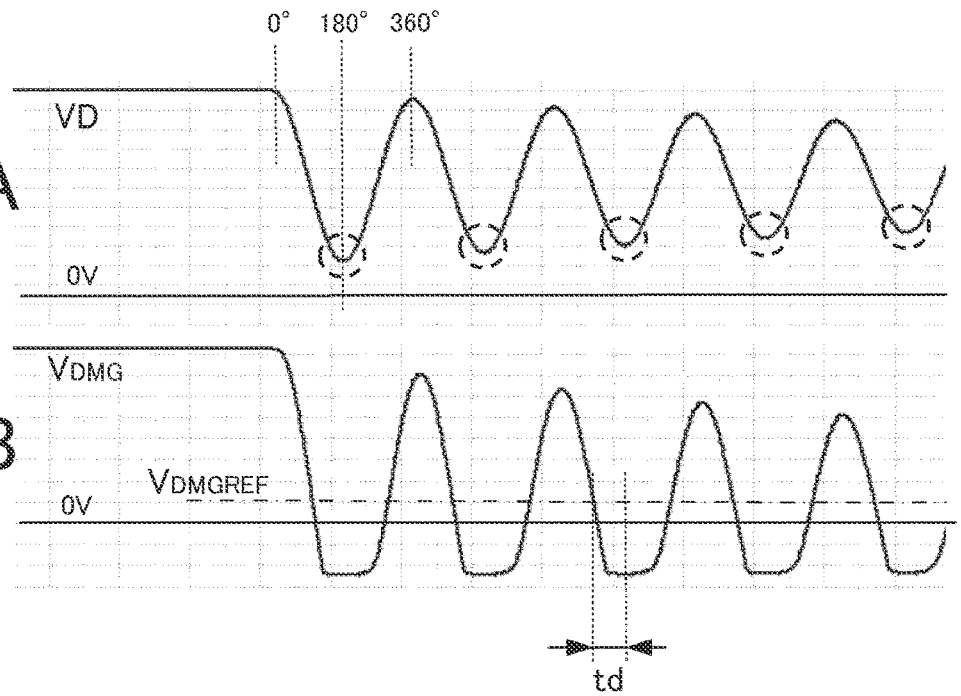
FIG. 3A and FIG. 3B are waveform diagrams illustrating preferred detection timing for a resonance detection circuit constituting the semiconductor device.
FIG. 4 is a circuit diagram showing a specific example of a time-out circuit constituting the semiconductor device.

In view of this, the embodiment includes the external terminal DMG to which a voltage obtained by dividing a voltage appearing on the auxiliary winding Nb of the transformer 12 with resistors R1, R2 is applied. The voltage VDMG of the external terminal DMG is monitored. As described above, a comparator is used as the resonance detection circuit 31. As shown in FIG. 3B, the reference voltage VDMGREF is set at a value slightly higher than 0V (zero volt) in relation to a resonant waveform of VDMG.

Since a resonance voltage of the auxiliary winding Nb fluctuates around 0V, the reference voltage VDMGREF of the semiconductor device is easily set. In semiconductor devices, an external terminal is generally provided with a diode (ESD protection diode) to prevent electrostatic breakdown. Similarly, the DMG terminal in the power control IC 13 of the embodiment is provided with an ESD protection diode DESD as shown in FIG. 2. A forward voltage of the diode DESD clamps a voltage of the DMG terminal around −0.7V.

In a case in which a comparator is used as the resonance detection circuit 31, the reference voltage VDMGREF is set preferably in consideration of delay (td) of a driver, the comparator, turning-on of a switch and the like so that the switching element SW1 is turned on when the drain voltage VD is at a bottom. Therefore, in the embodiment, the reference voltage VDMGREF is set at a voltage slightly higher than 0V as shown in FIG. 3B.

In the embodiment, the comparator detects a portion right in front of a bottom of the voltage VDMG obtained by dividing a voltage at the auxiliary winding Nb with resistors. However, the comparator may detect the voltage VDMG at a predetermined phase of resonance. To detect a time point of turning-on based on a phase of resonance, the detection circuit is preferably configured such that the time point is detected at a phase in a range between 90° and 180° in an assumption that the phase of resonance is initially 0°.

FIG. 4 shows a specific example of circuit configuration of the time-out circuit 32.

As shown in FIG. 4, the time-out circuit 32 includes:

a constant current source CC0;

a capacitor C0 connected in series with the constant current source CC0;

a MOS transistor M0 provided in parallel with the capacitor C0;

an inverter INV0 that inverts an output signal of the resonance detection circuit 31 and applies the inverted output signal to the gate terminal of the MOS transistor M0; and a comparator CMP0 that includes:

a non-inverted input terminal to which voltages of the constant current source CC0, the capacitor C0 and the connection node N0 are applied; and an inverted input terminal to which a reference voltage VTOREF is applied.

In this time-out circuit 32, usually the MOS transistor M0 is turned on, and a voltage of the connection node N0 is at a low level (ground potential). An output T0 of the comparator CMP0 is also at a low level. When the resonance detection circuit 31 detects resonance and the output signal RSN changes to a high level, the MOS transistor M0 is turned off. Operation to clock a predetermined period T2 is started. The capacitor C0 is charged by the constant current source CC0. The voltage of the connection node N0 gradually rises, and when it exceeds the reference voltage VTOREF, the output TO of the comparator CMP0 changes to a high level. A period from the time when charging of the capacitor C0 begins to the time when the voltage of the connection node N0 reaches the reference voltage VTOREF is the clocking period T2 of the time-out circuit 32.

Figure 5:
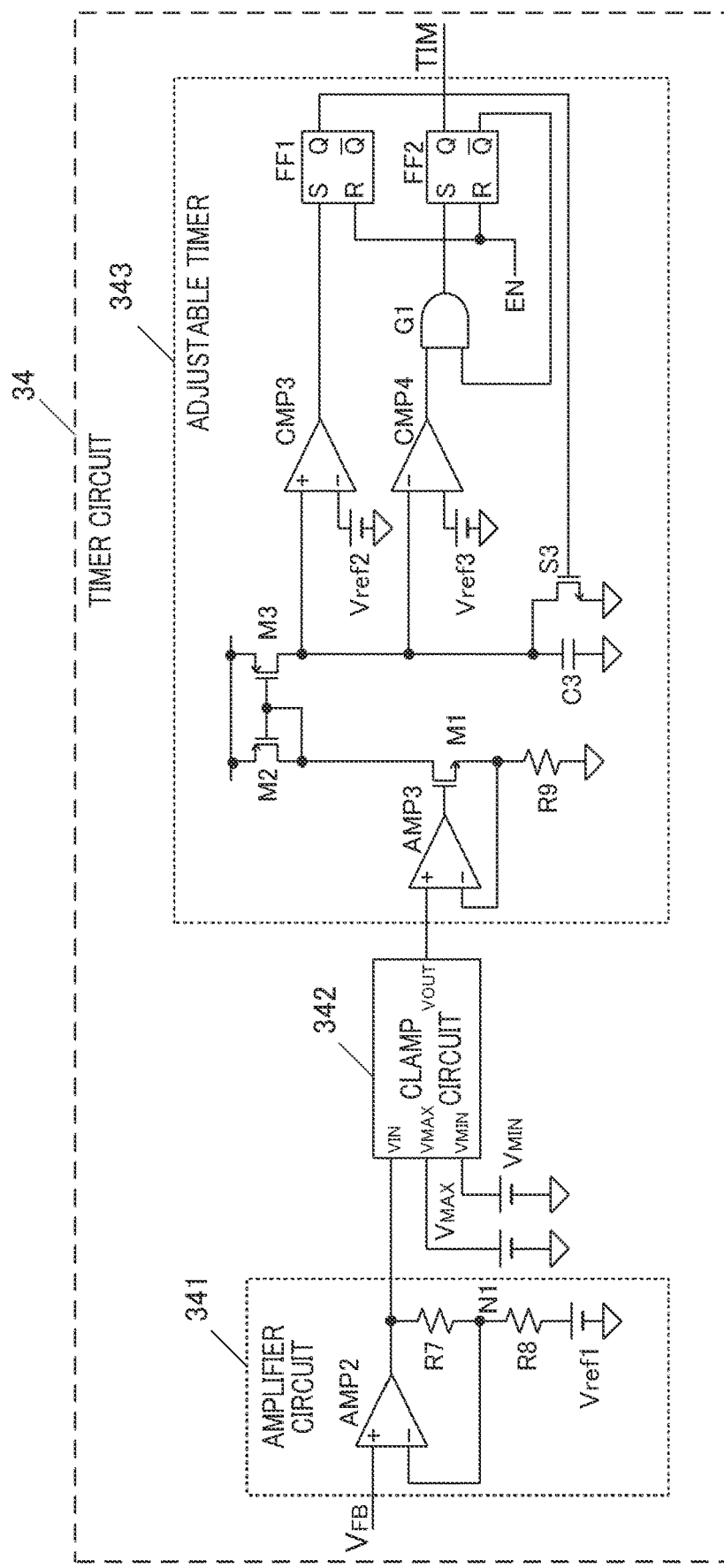
FIG. 5 is a circuit diagram showing a specific example of a timer circuit constituting the semiconductor device.

FIG. 5 shows a specific example of circuit configuration of the timer circuit 34.

As shown in FIG. 5, the timer circuit 34 includes:

an operational amplifier (arithmetic amplifier circuit) AMP2 that amplifies the voltage VFB of the external terminal FB;

voltage division resistors R7, R8 that divide an output of the operational amplifier AMP2;

an amplifier 341 which is provided between the resistor R8 and a ground point and which has a reference voltage Vref1 that raises a voltage of a connection node N1 between R7 and R8 by a predetermined amount;

a clamp circuit 342 that clamps an output voltage of the amplifier circuit 341 while performing computational amplification of the output voltage; and an adjustable timer 343.

The clamp circuit 342 is constituted by an arithmetic circuit having a function of clamping a voltage.

The adjustable timer 343 includes:

a voltage-to-current converter which includes an operational amplifier AMP3, a MOS transistor M1 and a resistor R9 and which converts an output voltage of the clamp circuit 342 into a current;

a current mirror circuit which consists of MOS transistors M2, M3 and which generates a current proportional to the converted current;

a capacitor C3 charged by a current of the MOS transistor M3; and a discharge switch S3 that discharges a charge of the capacitor C3.

The adjustable timer 343 includes:

two comparators CMP3, CMP4 to which a charged voltage of the capacitor C3 is input;

RS flip-flops FF1, FF2 that respectively latch outputs of the comparators CMP3, CMP4; and an AND gate G1 to which an output of the comparator CMP4 and an inverted output /Q of the RS flip-flop FF2 are input.

The discharge switch S3 is turned on and off by an output of the flip-flop FF1. The RS flip-flop FF1 is set by the output of the comparator CMP3. The RS flip-flop FF2 is set by an output of the AND gate G1. The RS flip-flops FF1, FF2 are reset by an output EN of the latch circuit 33. When the RS flip-flop FF1 is reset, the discharging switch S3 is turned off, and clocking begins.

A comparative voltage Vref2 applied to an inverted input terminal of the comparator CMP3 and a comparative voltage Vref3 applied to a non-inverted input terminal of the comparator CMP3 are set to keep relationship of Vref2>Vref3. When a charged voltage of the capacitor C3 reaches Vref3, the output of CMP4 sets the RS flip-flop FF2 as long as FF2 is reset. An output of FF2 changes from a low level to a high level. The output of FF2 is provided as a time-out signal TIM to the turn-on control circuit 35. When the charged voltage of the capacitor C3 reaches Vref2, the output of CMP3 sets the RS flip-flop FF1. An output of FF1 changes from a low level to a high level to turn on the discharge switch S3 and discharge a charge of the capacitor C3.

Figure 8A:
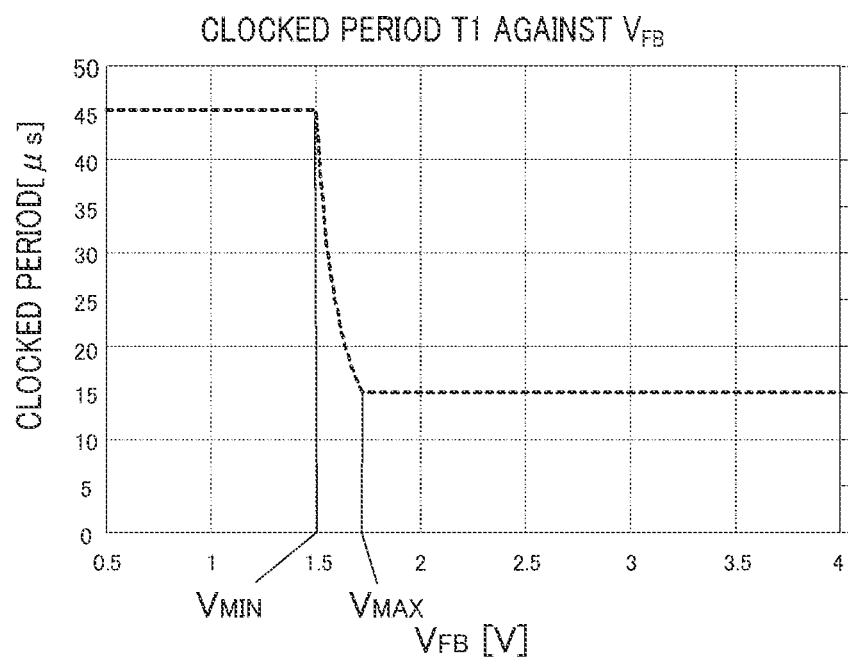
FIG. 8A is a graph showing relationship between a voltage of a FB terminal and time clocked by the timer circuit in the semiconductor device of the first embodiment.

The FIG. 8A shows relationship between the period T1, which is clocked by the timer circuit 34, and the voltage VFB of the external terminal FB. As shown in FIG. 8A, the clocking period T1 of the timer circuit 34 is designed such that relationship between the clocking period T1 and the voltage VFB of the external terminal FB is represented by the dashed line. A clamping voltage VMIN applied to the clamp circuit 342 limits the maximum of the clocking period T1. The clamping voltage VMAX (VMAX>VMIN) applied to the clamp circuit 342 limits the minimum of the clocking period T1. The arithmetic function of the clamp circuit 342 provides the T1-VFB curve between VMIN and VMAX.

Accordingly, the higher the voltage VFB of the external terminal FB (the smaller the load current on the secondary side), the shorter the period clocked by the timer circuit 34. As will be apparent in the following explanation, the embodiment uses this clocking period as a switching cycle in the PWM mode (continuous current mode) and also as a zero-current detection period in the quasi-resonance mode (discontinuous current mode). Therefore, according to the switching power supply using the power control IC 13 of the embodiment, an inverse of the clocking period T1 of the timer circuit 34 is the switching frequency.

Figure 6A:
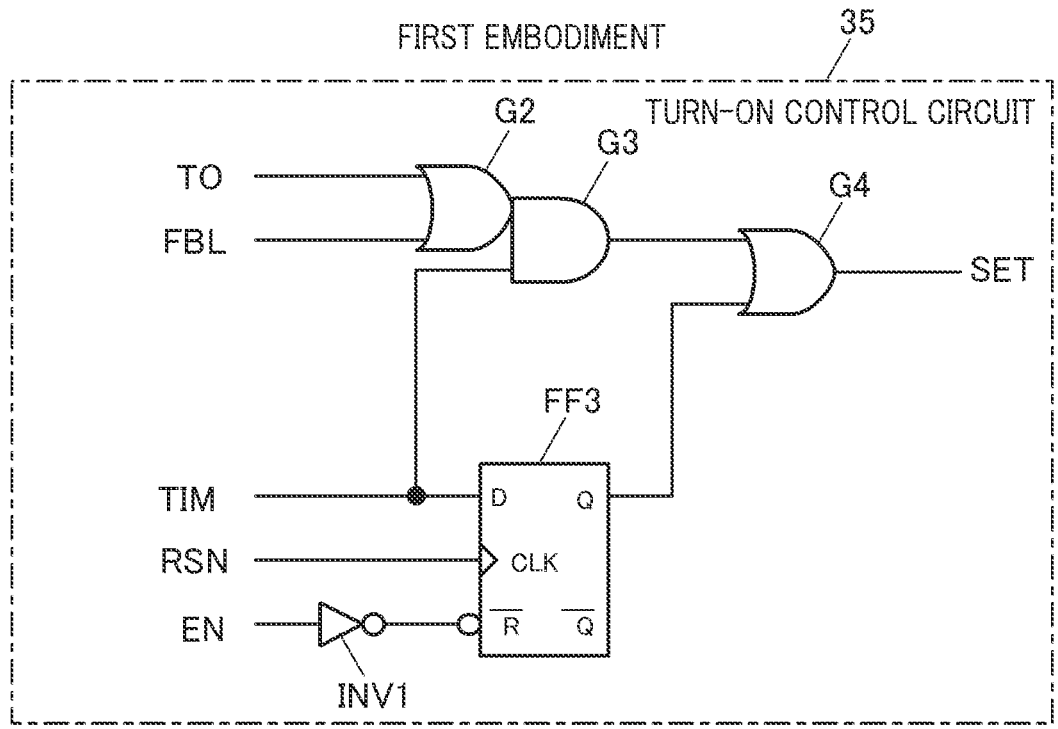
FIG. 6A is a circuit diagram showing a specific example of a turn-on control circuit constituting the semiconductor device of the first embodiment.

FIG. 6A shows a specific example of circuit configuration of the turn-on control circuit 35 in the power control IC 13 of the first embodiment.

As shown in FIG. 6A, the turn-on control circuit 35 includes:

an OR gate G2 to which the output signal TO of the time-out circuit 32 and the output signal FBL of the FB comparator 33 are input;

an AND gate G3 to which an output signal of the OR gate G2 and the output signal TIM of the timer circuit 34 are input;

a flip-flop FF3 which includes:
  a data terminal D to which the output signal TIM of the timer circuit 34 is input; and
  a reset terminal to which a signal obtained by inverting the output signal EN of the latch circuit 37 with an inverter INV1 is input; and an OR gate G4 to which an output signal of the flip-flop FF3 and an output signal of the AND gate G3 are input.

In the turn-on control circuit 35 of the embodiment, an output signal RSN of the resonance detection circuit 31 is input to a clock terminal of the flip-flop FF3. Therefore, in synchronization with rise of the output signal RSN of the resonance detection circuit 31, the output signal TIM of the timer circuit 34, which is an input signal of the data terminal D, is received. Accordingly, when the output signal RSN of the resonance detection circuit 31 rises, an output SET which is a turn-on signal changes to a high level if the output signal TIM of the timer circuit 34 is at a high level.

As long as the output signal TIM of the timer circuit 34 is at a high level, the output SET of the turn-on control circuit 35 changes to a high level when the time-out circuit 32 times out and the output signal TO of the time-out circuit 32 changes to a high level. When the output signal FBL of the FB comparator 33 is at a high level, i.e. the voltage VFB of the external terminal FB is lower than the reference voltage VFBREF, the output signal TIM of the timer circuit 34 changes to a high level so that the output SET changes to a high level. When the output SET of the turn-on control circuit 35 changes to a high level, the latch circuit 37 in FIG. 2 is set and the gate drive signal (GATE), which is an output of the driver circuit 38, changes to a high level. The switching element SW1 is turned on. A turn-on control circuit of the second embodiment in FIG. 6B will be described later.

Figure 7:
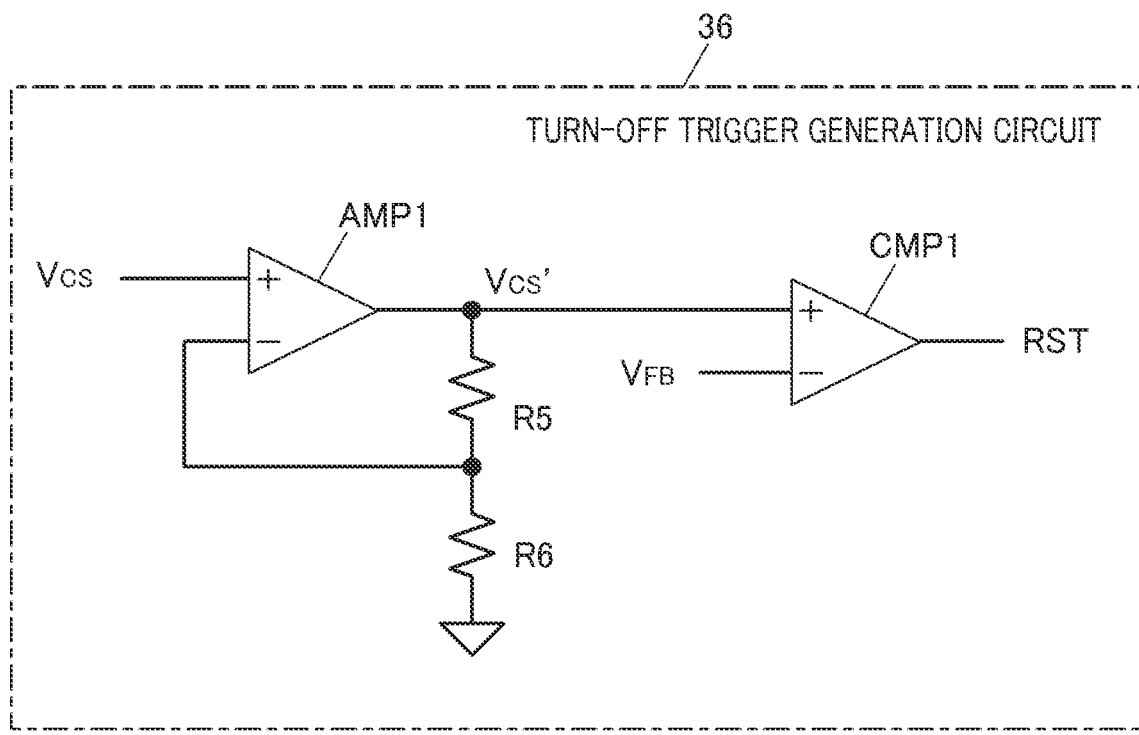
FIG. 7 is a circuit configuration diagram illustrating a specific example of a turn-off trigger generation circuit constituting the semiconductor device of the first embodiment and the second embodiment.

FIG. 7 shows a specific example of circuit configuration of the turn-off trigger generation circuit 36.

As shown in FIG. 7, the turn-off trigger generation circuit 36 includes:

an amplifier circuit which amplifies the voltage Vcs of the external terminal CS, the amplifier circuit including an operational amplifier AMP1 and voltage division resistors R5, R6 that divide an output voltage of the operational amplifier AMP1; and a comparator CMP1 which compares an output voltage of the amplifier circuit with the voltage VFB of the external terminal FB.

The voltage division resistors R5, R6 are provided between an output terminal of the operational amplifier AMP1 and a ground point. The operational amplifier AMP1 outputs a voltage Vcs' obtained by amplifying a voltage of a connection node between the input division resistors R5, R6 to match the voltage Vcs of the non-inverted input terminal in virtual grounding operation. When the output voltage Vcs' of the operational amplifier AMP1 exceeds VFB, an output RST of the comparator CMP1 changes to a high level.

Figure 8B:
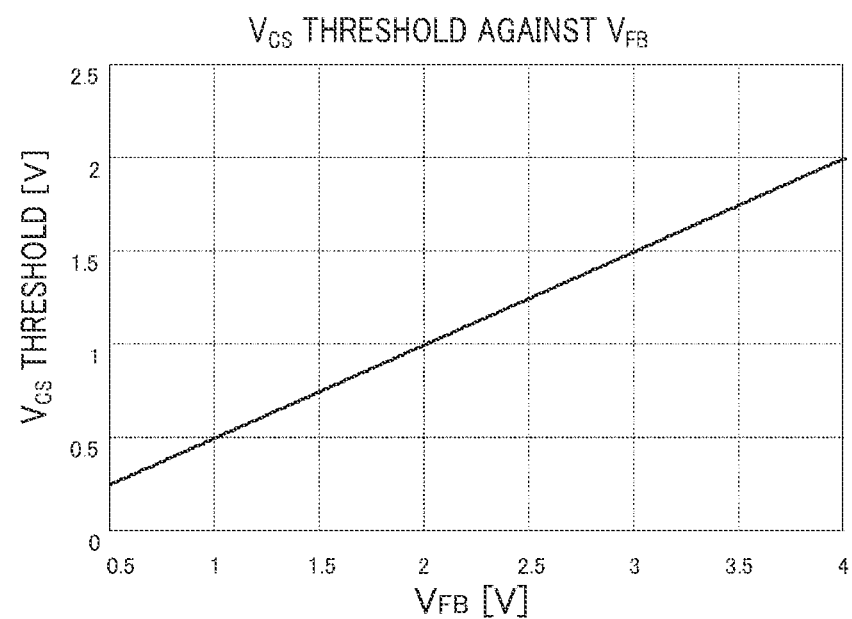
FIG. 8B is a graph showing relationship between the voltage of the FB terminal and a threshold of a voltage Vcs of a turn-off trigger generation circuit.

FIG. 8B shows relationship between a threshold of the voltage Vcs of the external terminal CS (Vcs voltage in turning off) and the voltage VFB of the external terminal FB in the turn-off trigger generation circuit 36. As shown in FIG. 8B, the threshold of the voltage Vcs is in proportion to the voltage VFB. The higher the voltage VFB, the higher the threshold of the voltage Vcs. The slope of the line representing the relationship between the threshold Vcs and the voltage VFB is adjusted by changing a resistance ratio of the voltage division resistors R5, R6 in FIG. 7.

Figure 9:
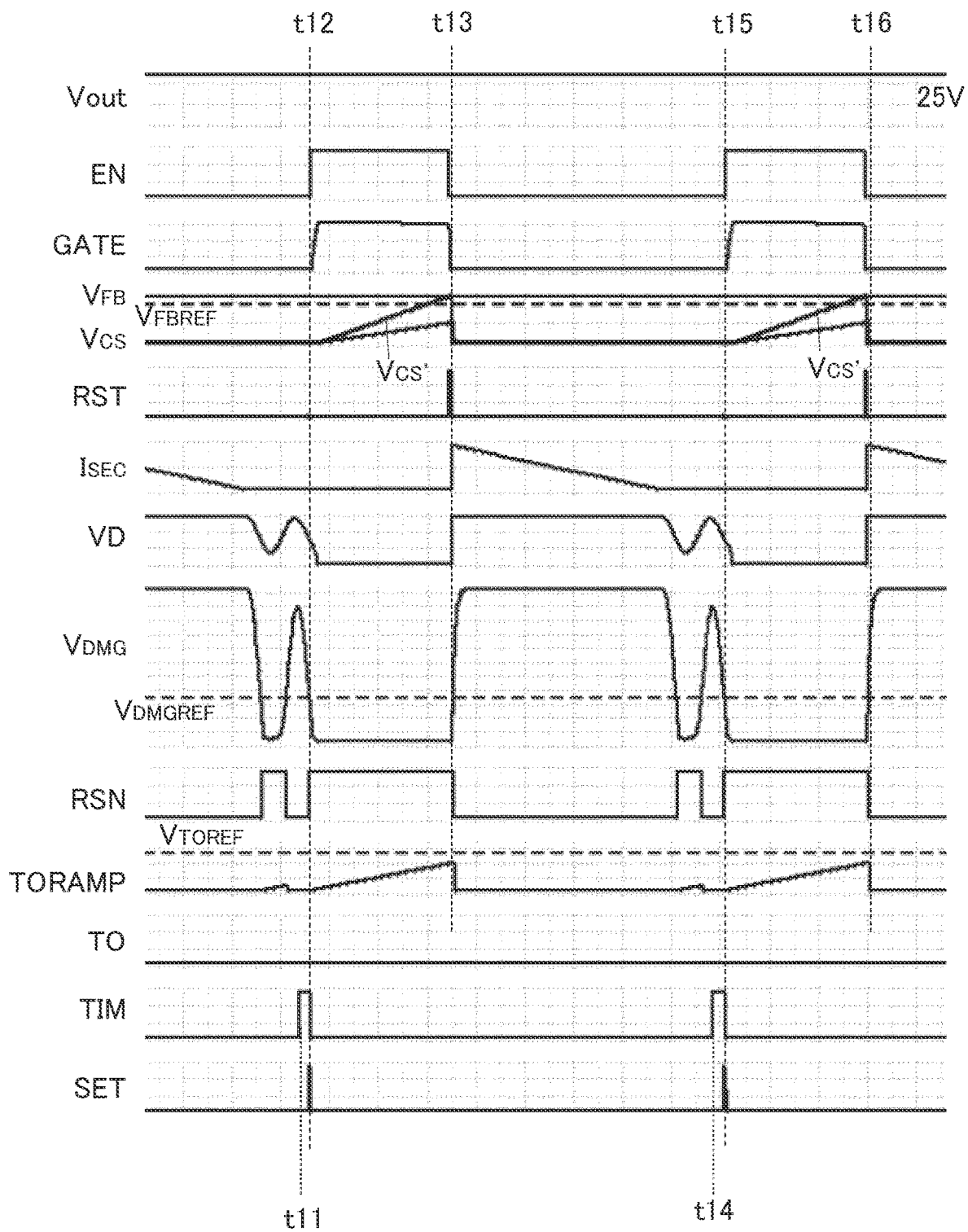
FIG. 9 is a timing chart showing change in signals of portions in the semiconductor device of the first embodiment when the device operates in a condition where the voltage of the FB terminal is sufficiently high and amplitude of a resonance voltage is large.
Figure 10:
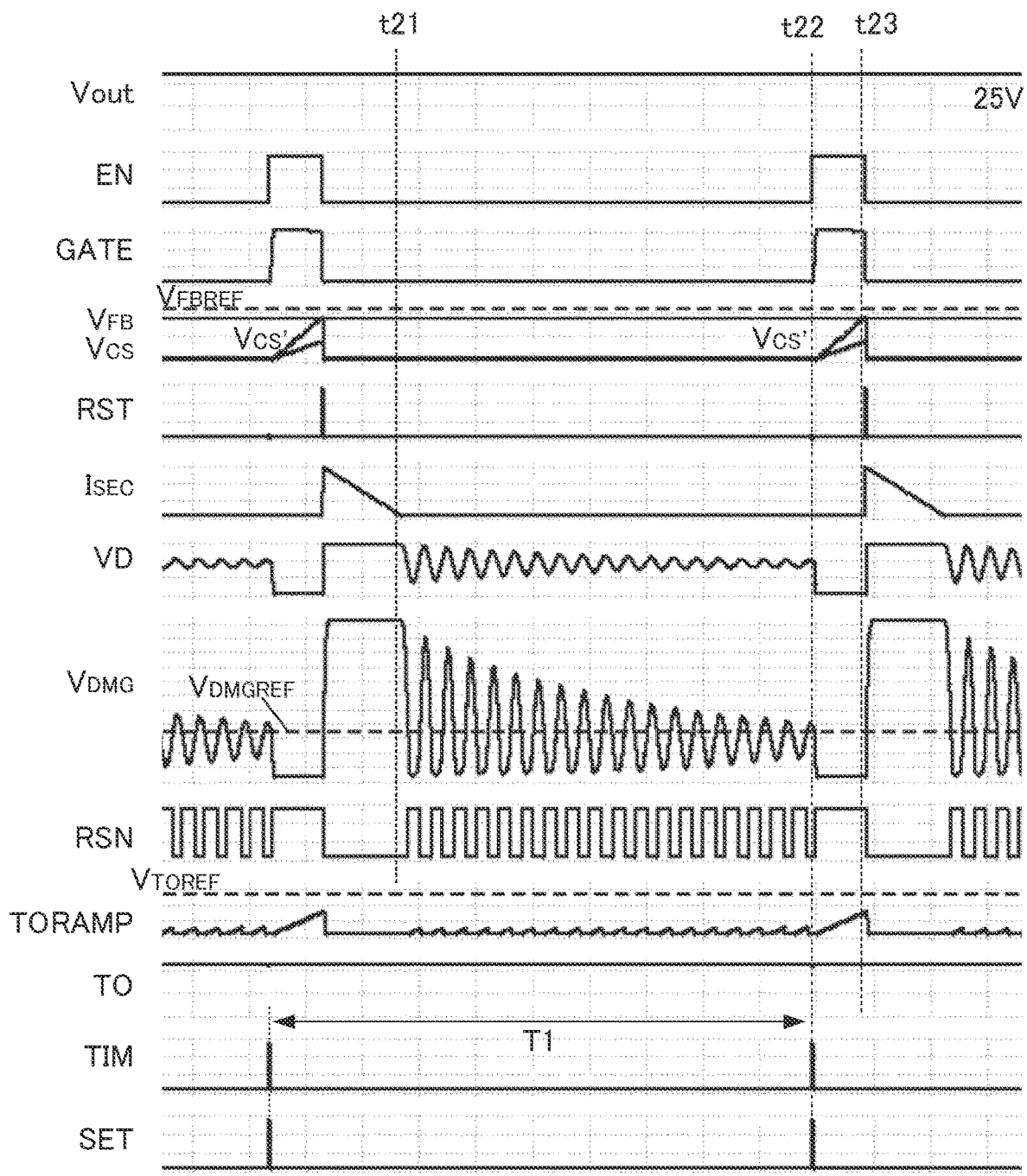
FIG. 10 is a timing chart showing change in signals of portions in the semiconductor device of the first embodiment when the device operates in a condition where the voltage of the FB terminal is low.

Next, operation of the power control IC 13 having the above-described configuration will be described with reference to the timing charts in FIGS. 9 and 10. FIG. 9 shows changes in signals of portions of the power control IC 13 in a condition where the voltage VFB of the terminal FB is high and where amplitude of resonance appearing in the voltage VDMG of the external terminal DMG is sufficiently large. FIG. 10 shows changes in signals of portions of the power control IC 13 in a condition where the voltage VFB of the external terminal FB is low but amplitude of resonance of the voltage VDMG of the external terminal DMG is relatively large.

In FIG. 9, the timer circuit 34 finishes clocking at time points t11, t14, and the output signal TIM changes to a high level from a low level. Then, at time points t12, t15, the voltage VDMG becomes lower than the reference voltage VDMGREF and an output RSN of the resonance detection circuit 31 changes to a high level for the first time after the time points t11, t14. At these time points t12, t15, the output SET of the turn-on control circuit 35 changes to a high level, and the output EN of the latch circuit 37 changes to a high level. A gate drive signal (GATE) output from the driver circuit 38 changes to a high level, and the switching element SW1 is turned on. When the output EN of the latch circuit 37 changes to a high level, the flip-flop FF2 of the timer circuit 34 is reset, and the TIM signal changes to a low level (t12, t15). The flip-flop FF1 is also reset, and the discharging switch S3 is turned off. Clocking in the next cycle begins.

When the switching element SW1 is turned on, a current flows through the primary winding of the transformer. Potential of a sense resistor, i.e. the voltage Vcs of the external terminal CS, gets gradually higher. The output RST of the turn-off trigger generation circuit 36 changes to a high level from a low level at the time points t13, t16 at which the output voltage Vcs' of the amplifier AMP1 of the turn-off trigger generation circuit 36 reaches the voltage VFB of the external terminal FB. The gate drive signal (GATE) output from the driver circuit 38 changes to a low level, and the switching element SW1 is turned off.

Thus, in FIG. 9, the switching element SW1 is turned on at the time point at which the resonance detection circuit 31 detects a bottom after the voltage VDMG of the external terminal DMG starts resonance. Therefore, the power control IC 13 controls switching in the quasi-resonance mode. Since the voltage VFB of the external terminal FB is high in the case of FIG. 9, the clocking period T1 of the timer circuit 34 is shorter. Therefore, the switching cycle is shorter, and the on-period of the switching element SW1 is longer than the switching cycle.

On the other hand, when the voltage VFB of the external terminal FB is low, the clocking period T1 of the timer circuit 34 is long. However, the output voltage Vout is set at a high value, such as 25V. Therefore, in a condition where the voltage VDMG of the external terminal DMG is relatively high in a demagnetization period of the secondary winding Ns as shown in FIG. 10, after a demagnetization period of the secondary winding Ns of the transformer ends at the time point t21 to start zero-current resonance, the timer circuit 34 clocks the set period T1 before the resonance detection circuit 31 becomes incapable of detecting resonance.

Accordingly, the output signal TIM of the timer circuit 34 changes to a high level at the time point t22 at which the timer circuit 34 has clocked the set period T1. When the TIM changes to the high level, the turn-on trigger signal SET changes to a high level, and the output EN of the latch circuit 37 changes to a high level. The gate drive signal (GATE) output from the driver circuit 38 changes to a high level, and the switching element SW1 is turned on.

When the switching element SW1 is turned on, a current flows through the primary winding of the transformer. Voltage drop in the sense resistor Rs becomes larger, and the voltage Vcs of the external terminal CS gets gradually higher. The output RST of the turn-off trigger generation circuit 36 changes to a high level from a low level at a time point t23 at which the output voltage AMP1 of the amplifier Vcs' of the turn-off trigger generation circuit 36 reaches the voltage VFB of the external terminal FB. The gate drive signal (GATE) output from the driver circuit 38 changes to a low level, and the switching element SW1 is turned off. Thus, in FIG. 10, the timer circuit 34 turns on the switching element SW1 at a time point at which the timer circuit 34 has clocked the set period T1. Accordingly, the power control IC 13 controls switching in the PWM mode.

The above explanation about operation shows that the turn-on control circuit 35 functions as a means of switching between the PWM mode and the quasi-resonance mode. In the power control IC 13 of the embodiment, the period T1 clocked by the timer circuit 34 and the like are appropriately designed so that the power control IC 13 is operated in the PWM mode in an area where a load current is approximately 100% of a rated load current while the power control IC 13 is operated in the quasi-resonance mode in an area where the load current is less than 100% of the rated load current. A power supply using the power control IC 13 of the embodiment has a lower power efficiency in the PWM mode than in the quasi-resonance mode. Therefore, the efficiency is not good when the power supply is operating with a current being approximately 100% of the rated load current. However, the power supply operates in the quasi-resonance mode with good power efficiency when the load current is, for example, 75%, 50% or 25% of the rated load current. Thus, the power supply achieves advantageous effect of having improved average power efficiency in comparison with a power supply that operates in the PWM mode in all the areas.

The size of the transformer 12 should be determined such that a core is not saturated when the winding current flowing through the primary winding of the transformer is at its maximum. The larger the winding current, the larger the size required for the transformer. In the quasi-resonance mode, operation is always performed in the discontinuous current mode. Therefore, when a load is around a rated load, the switching frequency is lowered and the peak of the winding current is increased. On the other hand, in the PWM mode, operation is performed in the continuous current mode. The frequency does not fall even when a load is around a rated load, and the peak of the winding current is lower than the peak in the quasi-resonance mode. The size of the transformer can be smaller than the size in a single quasi-resonance mode.

The higher the frequency, the smaller the impedance of an output capacitor, and the larger the effect of preventing an output ripple. Therefore, when a load is around a rated load as described above, the frequency is higher in operation in the PWM mode than in operation in the quasi-resonance mode. Thus, the capacitance and the size of the output capacitor are reduced.

Figure 11:
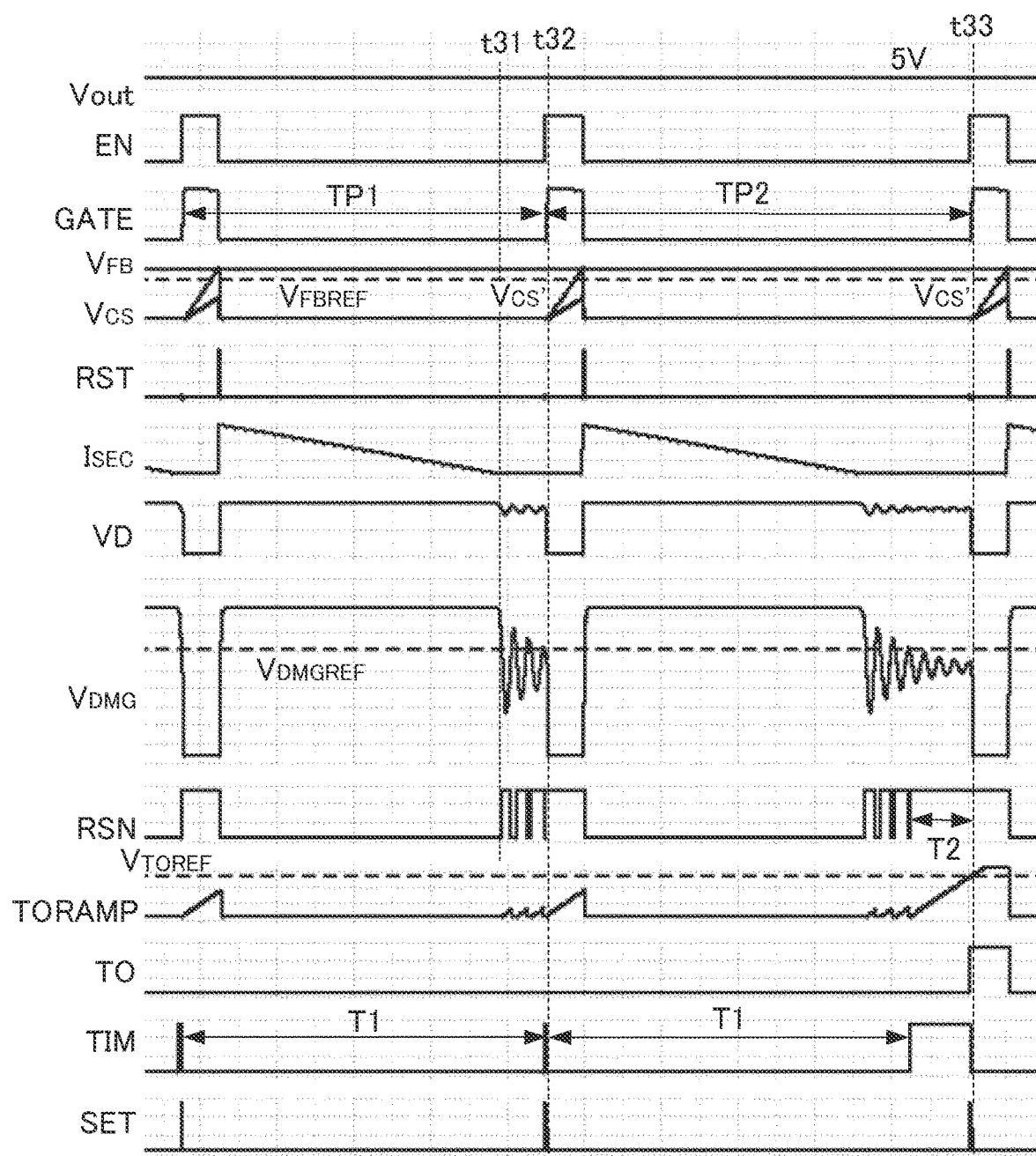
FIG. 11 is a timing chart showing change in signals of portions in the semiconductor device of the first embodiment when the device operates in a condition where the voltage of the FB terminal is high and the amplitude of the resonance voltage is small.

According to a switching power supply using the power control IC 13 of the first embodiment, when the output voltage Vout is switched to a lower voltage, such as 5V, the voltage VDMG of the external terminal DMG is reduced in a demagnetization period of the secondary winding Ns as shown in FIG. 11. The demagnetization period of the secondary winding Ns of the transformer ends at the time point t31, and resonance begins. In this circumstance, when the voltage VDMG nearly reaches the reference voltage VDMGRE, the resonance detection circuit 31 occasionally comes into an edge condition in which the resonance detection circuit 31 sometimes detects resonance and sometimes not.

If this happens at a time point at which the set period T1 of the timer circuit 34 ends, two cases occurs. In the first case, the resonance detection circuit 31 detects resonance at a time point t32 for the first time after the timer circuit 34 has clocked the set period T1. At the same time, the output TIM of the timer circuit 34 changes to a high level. The turn-on signal SET rises, and the switching element SW1 is turned on. In the second case, the resonance detection circuit 31 becomes incapable of detecting resonance before the timer circuit 34 clocks the set period T1. The time-out circuit 32 clocks the set period T2 and times out at a time point t33. At this time point, the turn-on signal SET rises, and the switching element SW1 is turned on. Thus, two operations coexist.

In a case in which the set periods T1, T2 of the timer are respectively set at 25 μs and 9 μs, the minimum value of the cycle TP1 is 25 μs, and the maximum value of the cycle TP2 is 34 μs. Therefore, switching cycles in a range between 25 μs and 34 μs coexist in the edge condition where resonance is sometimes detected and sometimes not. It brings problems of a large ripple of an output voltage and sound noise.

An improved power control IC has been made to solve those problems. This improved power control IC is the second embodiment. Details of the second embodiment will be described with reference to FIG. 12 to FIG. 17.

Second Embodiment

Figure 12:
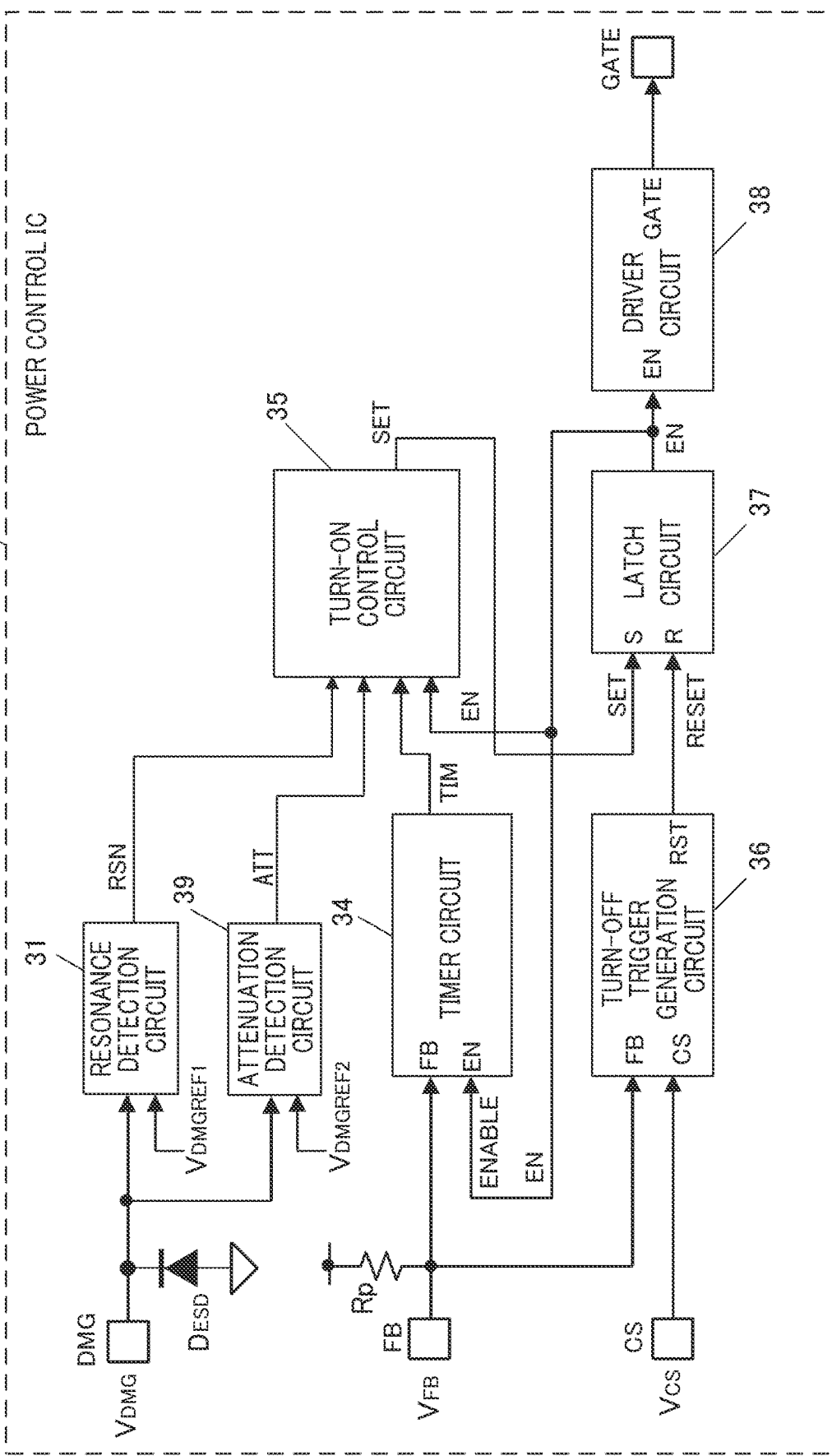
FIG. 12 is a circuit diagram showing the second embodiment of the semiconductor device according to the present invention on the primary side of the transformer in the DC-DC converter in FIG. 1.

FIG. 12 shows configuration of functional blocks of the power control IC 13 of the second embodiment.

The power control IC of the second embodiment in FIG. 12 has a configuration similar to the one in the power control IC of the first embodiment in FIG. 2. The difference from the power control IC of the first embodiment in FIG. 2 is that the power control IC of the second embodiment does not have the FB comparator 33 in the power control IC of the first embodiment, but has an attenuation detection circuit 39 instead. The attenuation detection circuit 39 monitors the voltage VDMG of the external terminal DMG and detects attenuation of a resonance voltage. Although the power control IC 13 of the second embodiment in FIG. 12 does not have the time-out circuit 32 in the power control IC of the first embodiment, the attenuation detection circuit 39 in the second embodiment has the same function as the time-out circuit 32 of the first embodiment. Therefore, the substantial difference is that the FB comparator 33 is replaced with the attenuation detection circuit 39.

Figure 13A:
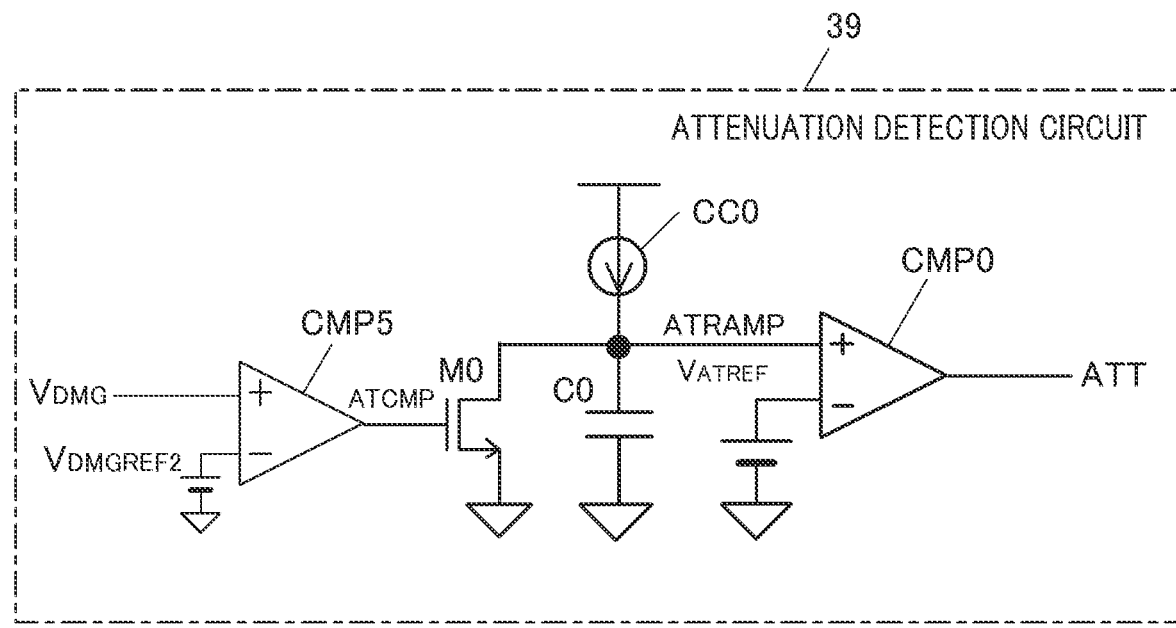
FIG. 13A is a circuit diagram showing a specific example of an attenuation detection circuit for a resonance voltage which constitutes the semiconductor device of the second embodiment.

FIG. 13A shows a specific circuit example of the attenuation detection circuit 39.

As shown in FIG. 13A, the attenuation detection circuit 39 of this embodiment has a configuration similar to the time-out circuit 32 in FIG. 4 except that the inverter INV0 is replaced with a comparator CMP5.

The comparator CMP5 compares the voltage VDMG with a predetermined reference voltage VDMGREF2, the voltage VDMG being obtained by dividing a voltage of the auxiliary winding Nb input to the external terminal DMG with resistors. When the voltage VDMG of the external terminal DMG is lower than the reference voltage VDMGREF2, the output changes to a low level, and the MOS transistor M0 is turned off. Then, subsequent time-out circuits M0, CC0, C0, CMP0 begin clocking operation.

Figure 13B:
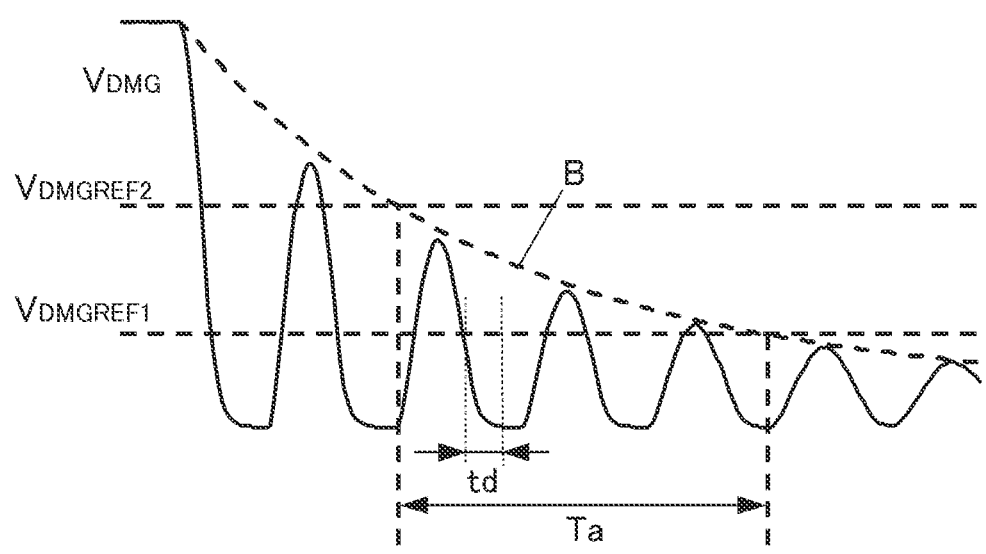
FIG. 13B is a wave diagram showing relationship between the resonance voltage and a reference voltage in the attenuation detection circuit according to the embodiment.

The reference voltage VDMGREF2 is applied to an inverted input terminal of the comparator CMP5. The reference voltage VDMGREF2 is higher than the voltage VDMGREF1 (e.g., 0.1V). As shown in FIG. 13B, the voltage VDMGREF1 is set such that the power is turned on when resonance is at the bottom, taking account of delays (td) of a comparator, a driver, and turn-on of a switch. As shown with the dashed line B in FIG. 13B, the reference voltage VDMGREF2 is set such that the resonance amplitude is longer than the cycle of resonance and is sufficiently shorter than a period Ta required for attenuating from VDMGREF2 to VDMGREF1. Specifically, if the period Ta required for presumed attenuation is 40 μs and the cycle of resonance is 5 μs, the clocking period T2 of the time-out circuits M0, CC0, C0, CMP0 is set at 9 μs, for example. In that case, the reference voltage VDMGREF2 is set at a voltage such as 0.5V.

Figure 6B:
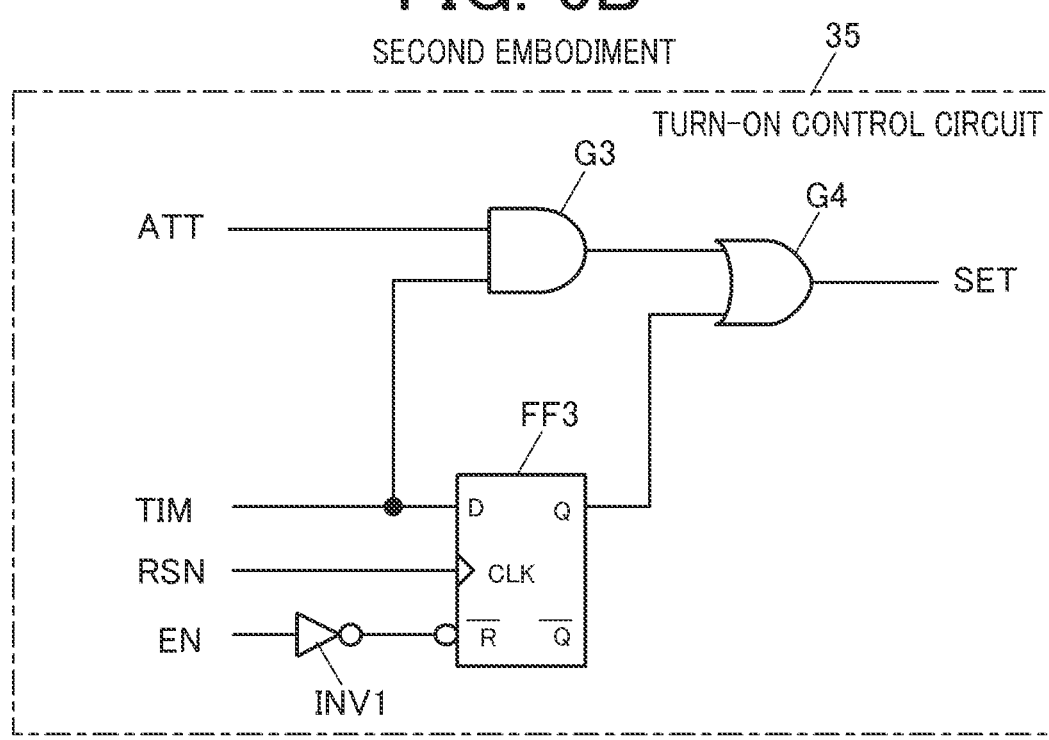
FIG. 6B is a circuit diagram showing a specific example of a turn-on control circuit constituting the semiconductor device of a second embodiment.

The OR gate G2 in the turn-on control circuit 35 of the first embodiment in FIG. 6A is omitted in the turn-on control circuit 35 in FIG. 6B. Output ATT of the attenuation detection circuit 39 is input to an AND gate G3.

The resonance detection circuit 31, the timer circuit 34, the turn-off trigger generation circuit 36, the latch circuit 37 and the driver circuit 38 are the same as those in the first embodiment. Hereinafter, operation of the power control IC 13 of the second embodiment having the above attenuation detection circuit 39 will be described with reference to timing charts of FIG. 14 to FIG. 17.

Figure 14:
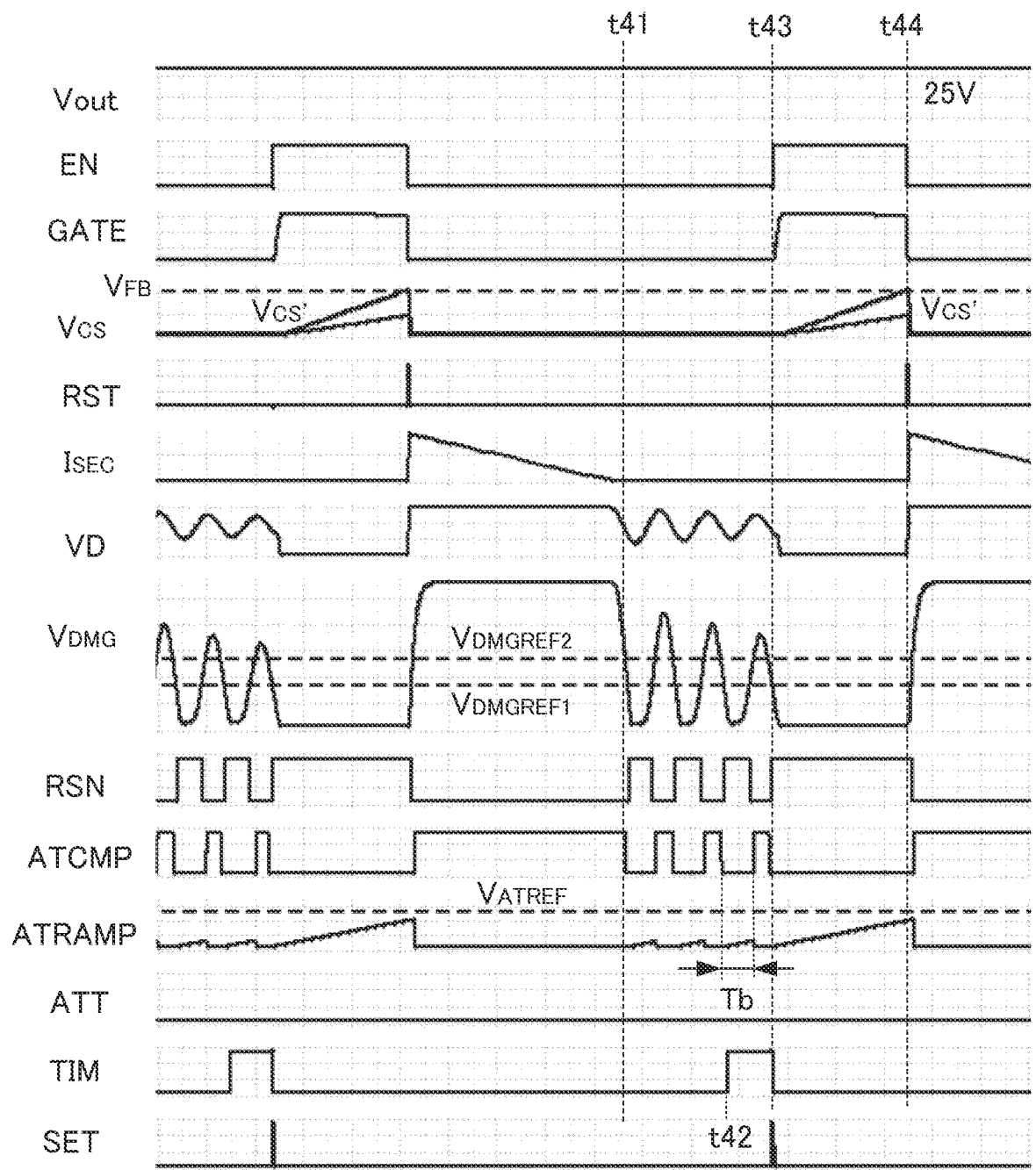
FIG. 14 is a timing chart showing changes in signals of portions in the semiconductor device of the second embodiment in a condition where the timer circuit begins clocking before attenuation of a zero-current resonance voltage.

FIG. 14 is a timing chart showing changes in signals of portions in the switching power control IC 13 of the second embodiment in a case in which the timer circuit 34 begins clocking before attenuation of a zero-current resonance voltage.

In the timing chart of FIG. 14, the resonance detection circuit 31 and the comparator CMP5 of the attenuation detection circuit 39 detect resonance of VDMG at a time point t41. Outputs RSN and ATCMP are respectively reversed. Then, the time-out circuit M0, CC0, C0, CMP0 of the attenuation detection circuit 39 begin clocking of the predetermined set period T2 every time the output ATCMP of CMP5 falls. However, the output ATCMP rises before T2 is clocked. Therefore, the attenuation detection circuit 39 determines that a low-level period Tb of ATCMP is shorter than the predetermined period T2, that is, resonance of VDMG is not attenuated. The output ATT of the attenuation detection circuit 39 keeps a low level.

Therefore, the output SET of the turn-on control circuit 35 changes to a high level at a time point t43 at which the resonance detection circuit 31 detects resonance for the first time after a time point t42 at which the output TIM changes to a high level after the timer circuit 34 begins clocking. The latch circuit 37 is set, and the switching element SW1 is turned on. Then, the voltage Vcs' (output of the amplifier AMP1 in FIG. 7) proportional to the voltage Vcs of the terminal CS reaches the voltage VFB of the terminal FB. At a time point t44 at which the turn-off trigger generation circuit 36 detects this, the turn-off trigger generation circuit 36 resets the latch circuit 37, and the switching element SW1 is turned off.

The power control IC 13 operates in the quasi-resonance mode in this condition through the above operation.

Figure 15:
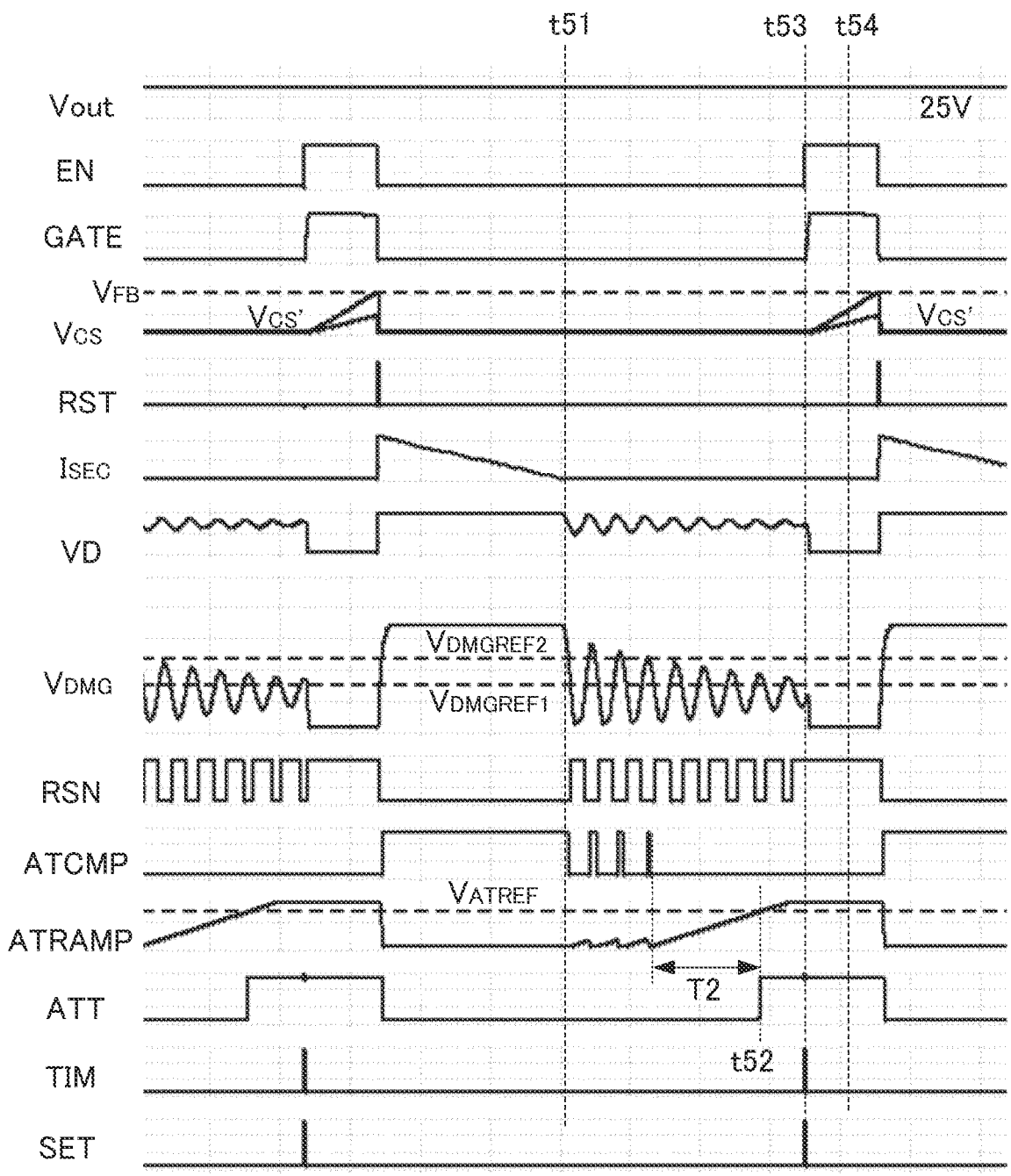
FIG. 15 is a timing chart showing changes in signals of portions in a condition where the timer circuit begins clocking after attenuation of the zero-current resonance voltage.

FIG. 15 is a timing chart showing changes in signals of portions in the switching power control IC 13 of the second embodiment in a case in which the timer circuit 34 finishes clocking of the set period T1 after attenuation of a zero-current resonance voltage.

In the timing chart of FIG. 15, the resonance detection circuit 31 and the comparator CMP5 of the attenuation detection circuit 39 detect resonance of VDMG at a time point t51. The outputs RSN and ATCMP are respectively reversed. Then, the time-out circuit of the attenuation detection circuit 39 begins clocking of the set period T2 every time the output ATCMP of CMP5 falls. If resonance is attenuated, ATCMP does not rise even after T2 is clocked. Therefore, the attenuation detection circuit 39 determines that resonance of VDMG is attenuated. The output ATT changes to a high level at a time point t52 at which T2 has been clocked.

Therefore, at a time point t53 at which the output TIM changes to a high level after the timer circuit 34 begins clocking, the output SET of the turn-on control circuit 35 changes to a high level. The latch circuit 37 is set, and the switching element SW1 is turned on. The voltage Vcs' (output of the amplifier AMP1 in FIG. 7) proportional to the voltage Vcs of the terminal CS reaches the voltage VFB of the terminal FB. At a time point t54 at which the turn-off trigger generation circuit 36 detects this, the turn-off trigger generation circuit 36 resets the latch circuit 37, and the switching element SW1 is turned off.

In a case in which a period of zero-current resonance is relatively long, attenuation of VDMG is detected and the switching element SW1 is turned on through the above operation.

Figure 16:
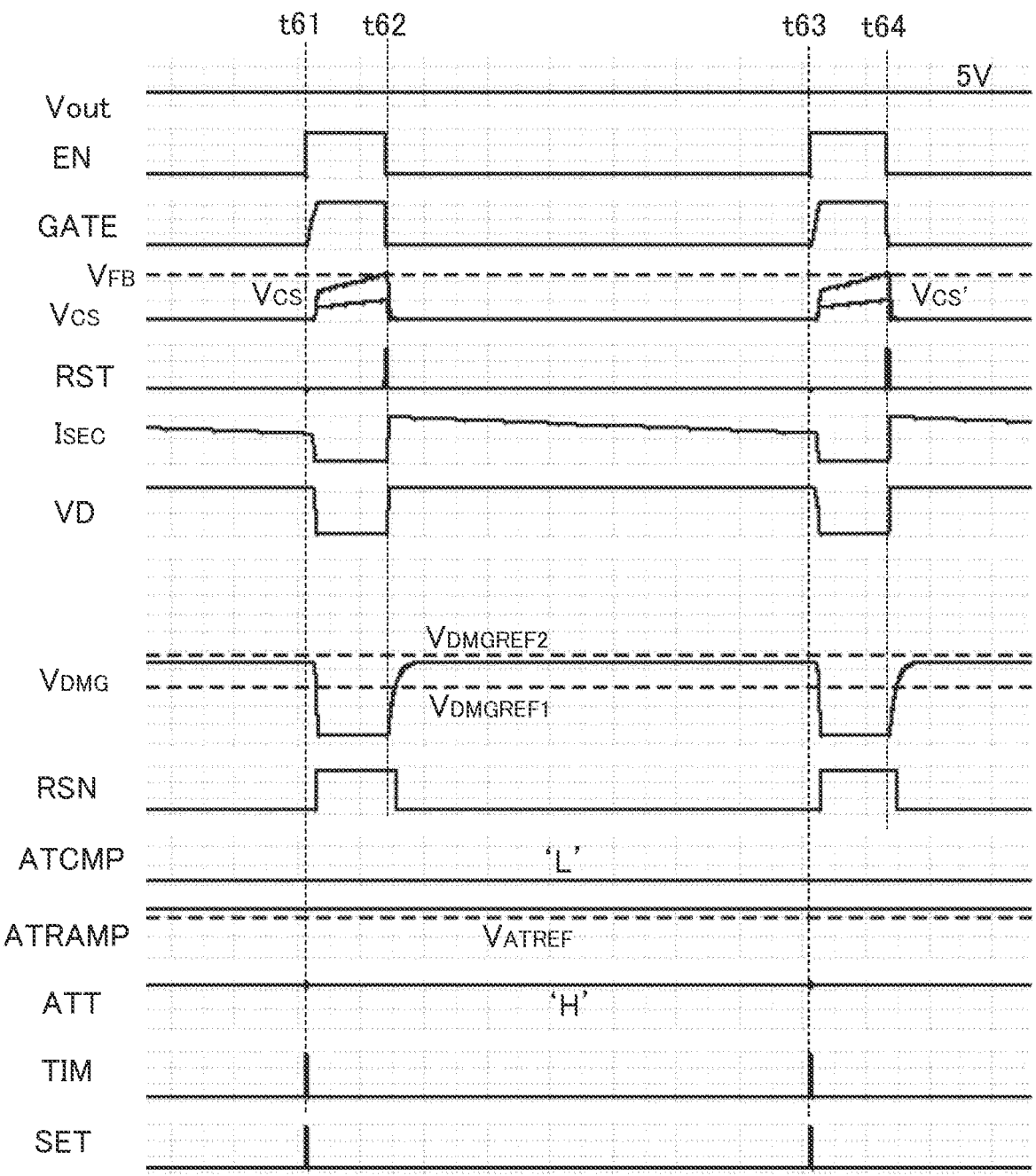
FIG. 16 is a timing chart showing changes in signals of portions in a condition where the timer circuit begins clocking while a voltage of a DMG terminal is low (low output voltage) during a demagnetization period of a secondary winding.

In the switching power control IC 13 of the second embodiment, when the output voltage Vout is set at a low value (e.g., 5V), the voltage VDMG of the external terminal DMG in a demagnetization period of the secondary winding of the transformer 12 becomes lower than the reference voltage VDMGREF2 in the attenuation detection circuit 39, and the timer circuit 34 finishes clocking of period T1 within the demagnetization period. FIG. 16 is a timing chart showing changes in signals of portions in this condition.

In the timing chart of FIG. 16, the output ATCMP of the comparator CMP5 in the attenuation detection circuit 39 continuously keeps a low level while the output ATT of the comparator CMP0 keeps a high level. It is determined that the voltage VDMG is attenuated. Therefore, at time points t61, t63 at which the output TIM changes to a high level after the timer circuit 34 clocks the set period T1, the output SET of turn-on control circuit 35 changes to a high level. The latch circuit 37 is set, and the switching element SW1 is turned on. That is, operation is performed in the so-called continuous current mode in which SW1 is turned on during a demagnetization period of the secondary winding. The voltage Vcs' (output of the amplifier AMP1 in FIG. 7) proportional to the voltage Vcs of the terminal CS reaches the voltage VFB of the terminal FB. At time points t62, T64 at which the turn-off trigger generation circuit 36 detects this, the turn-off trigger generation circuit 36 resets the latch circuit 37, and the switching element SW1 is turned off.

The power control IC 13 operates in the PWM mode in this condition through the above operation.

Figure 17:
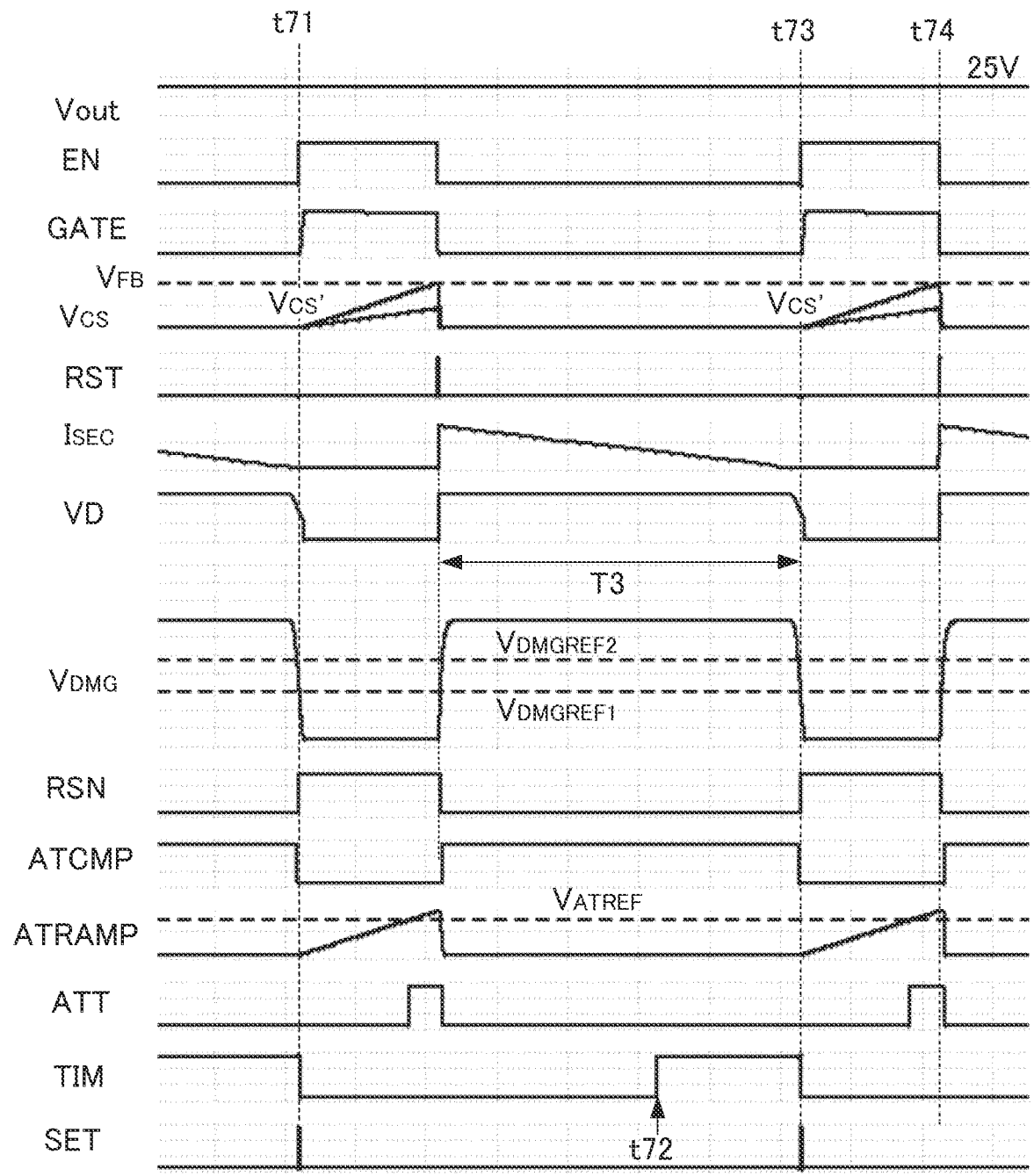
FIG. 17 is a timing chart showing changes in signals of portions in a condition where the timer circuit begins clocking while a voltage of the DMG terminal is sufficiently high (high output voltage) during a demagnetization period of the secondary winding.

In the switching power control IC 13 of the second embodiment, when the output voltage Vout is set at a higher value (e.g., 25V), the voltage VDMG of the external terminal DMG in a demagnetization period of the secondary winding of the transformer 12 becomes sufficiently higher than the reference voltage VDMGREF2 in the attenuation detection circuit 39, and the timer circuit 34 begins clocking during the demagnetization period. FIG. 17 is a timing chart showing changes in signals of portions in this condition.

In the timing chart of FIG. 17, the resonance detection circuit 31 detects fall of VDMG at time points t71, t73, and the output RSN changes to a high level. On the other hand, the output ATCMP of the comparator CMP5 in the attenuation detection circuit 39 keeps a high level during a demagnetization period T3 of the secondary winding while the output ATT of the comparator CMP0 keeps a low level. It is determined that the voltage VDMG is not attenuated. Therefore, after a time point t72 at which the timer circuit 34 begins clocking, and after demagnetization of the secondary winding, zero-current resonance begins and VDMG falls at a time point 73. At this time point 73, the output TIM changes to a low level, and the output SET of the turn-on control circuit 35 changes to a high level. The latch circuit 37 is set, and the switching element SW1 is turned on.

The voltage Vcs' (output of the amplifier AMP1 in FIG. 7) proportional to the voltage Vcs of the terminal CS reaches the voltage VFB of the terminal FB. At a time point t74 at which the turn-off trigger generation circuit 36 detects this, the turn-off trigger generation circuit 36 resets the latch circuit 37, and the switching element SW1 is turned off.

The power control IC 13 operates in the PWM-mode in this condition through the above operation.

Also in the power control IC of the second embodiment, operation is performed in the PWM mode while a load is around a rated load. Otherwise, operation is performed in the quasi-resonance mode. It reduces a capacitance value and size of a capacitor connected to a terminal on the secondary side. The power control IC of the second embodiment has advantage that, when the output voltage Vout is switched, attenuation of resonance voltage is detected without changing the reference voltage VDMGREF2 of the comparator CMP5 in the attenuation detection circuit 39.

Modification

Figure 18:
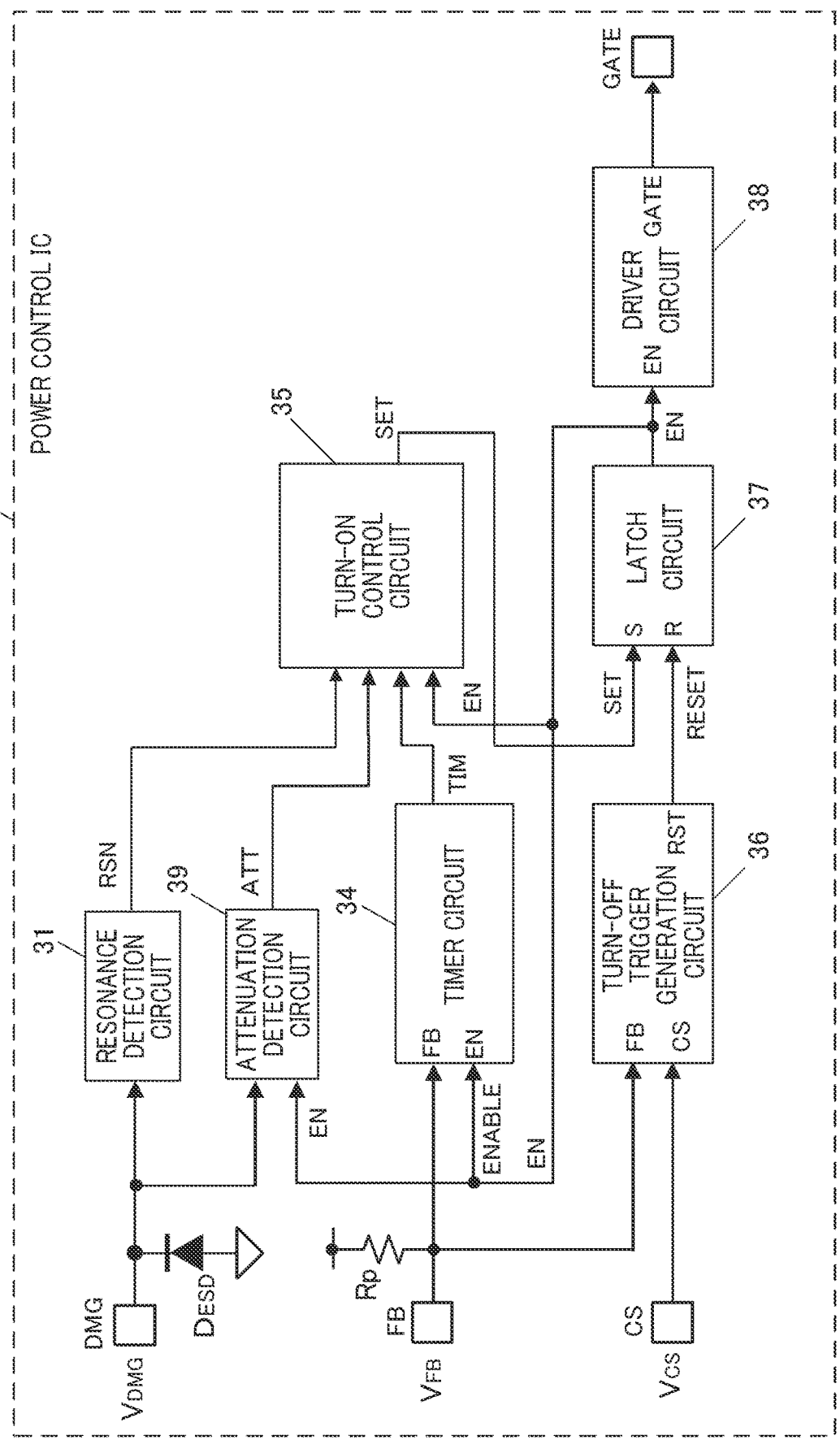
FIG. 18 is a functional block diagram showing modification of the semiconductor device of the second embodiment in FIG. 12.
Figure 19:
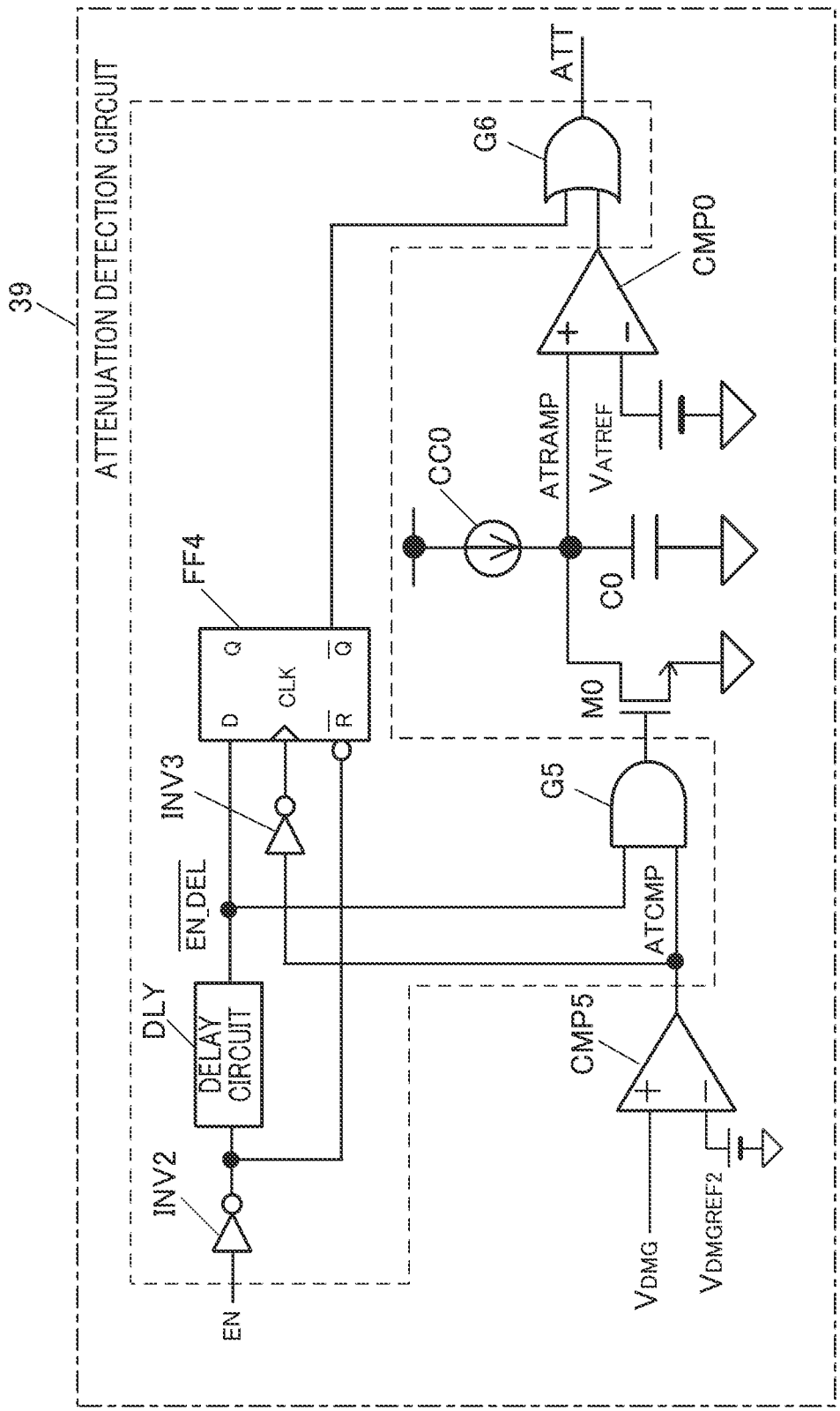
FIG. 19 is a circuit diagram showing a specific example of the attenuation detection circuit for the resonance voltage which constitutes the semiconductor device according to the modification in FIG. 18.

FIG. 18 shows configuration of functional blocks in a modification of the power control IC 13 of the second embodiment. FIG. 19 shows an example of circuit configuration of the attenuation detection circuit 39 in the power control IC 13 of the modification.

As shown in FIG. 18, in the power control IC 13 of this modification, the attenuation detection circuit 39 is provided with a terminal to which the output EN of the latch circuit 37 is input. The attenuation detection circuit 39 having this EN-input terminal has configuration shown in FIG. 19. As is known from comparison between this attenuation detection circuit 39 and the one in the power control IC 13 of the second embodiment shown in FIG. 13A, the attenuation detection circuit 39 in this modification has the circuit of the portion surrounded by the dashed line in addition to the circuit shown in FIG. 13A.

Specifically, as shown in FIG. 19, the attenuation detection circuit 39 of the power control IC 13 of this modification additionally includes:

an inverter INV2 that logically inverts the output EN of the latch circuit 37;

a delay circuit DLY that delays an output of the inverter INV2 by a short period Td of about 1-3 µs;

an AND gate G5 that logically adds an output /EN_DEL of the delay circuit DLY to the output ATCMP of the comparator CMP5 that compares the voltage VDGM of the external terminal DMG with the reference voltage VDMGREF2;

an inverter INV3 that inverts the output of the comparator CMP5;

a flip-flop FF4 that receives the output /EN_DEL of the delay circuit DLY using an output of the inverter INV3 as a clock signal; and an OR gate G6 that logically adds an output of the comparator CMP0 to an inverted output /Q of the flip-flop FF4.

Figure 20:
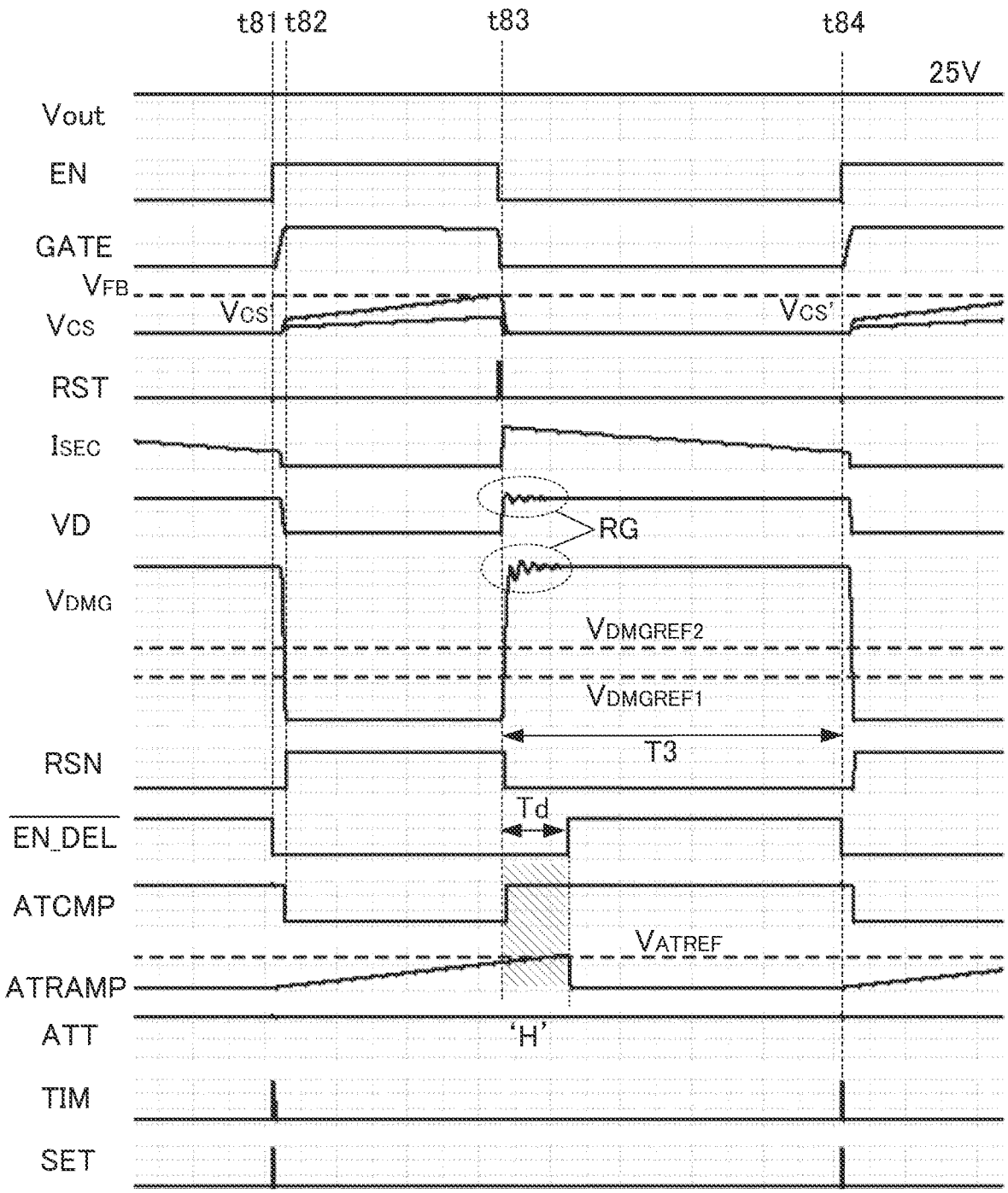
FIG. 20 is a timing chart showing changes in signals of portions in the semiconductor device according to the modification in FIG. 18 in a condition where the timer circuit begins clocking while the voltage of the DMG terminal is sufficiently high (high output voltage) during a demagnetization period of the secondary winding.

In the power control IC 13 of the modification, when the output voltage Vout is set at a higher voltage value (e.g., 25V), the voltage VDMG of the external terminal DMG during a demagnetization period of the secondary winding of the transformer 12 becomes sufficiently higher than the reference voltage VDMGREF2 in the attenuation detection circuit 39, and the timer circuit 34 begins clocking during the demagnetization period. FIG. 20 shows a timing chart showing changes in signals of portions in this condition.

In the timing chart of FIG. 20, the output EN of the latch circuit 37 is changed to a high level at a time point t81, and the switching element SW1 is turned on. Thereby the resonance detection circuit 31 detects fall of the voltage VDMG, and the output RSN of the resonance detection circuit 31 is changed to a high level. RSN changes to a low level at a time point t83 at which VDMG rises.

In the attenuation detection circuit 39 of the power control IC 13 of the modification, the delay circuit DLY generates a signal /EN_DEL obtained by delaying a reverse signal of the output EN of the latch circuit 37 by Td. This signal provides a mask period of ringing RG immediately after rise of the voltage VDMG of the external terminal DMG. The delay signal /EN_DEL of the delay circuit DLY is latched in the flip-flop FF4 through fall (t82) of the output ATCMP of the comparator CMP5. The inverted output /Q of FF4 changes to a high level (not shown).

Thereby the output ATCMP of the comparator CMP5 changes to a high level during the demagnetization period T3 of the secondary winding. However, the inverted output /Q of the flip-flop FF4 keeps the output ATT of the OR gate G6 at a high level. Therefore, the AND gate G3 of the turn-on control circuit 35 in FIG. 6B is opened. At a time point (t84 in FIG. 20) at which the timer circuit 34 finishes clocking and, at the same time, the output TIM changes to a high level, the output SET of the turn-on control circuit 35 changes to a high level, and the latch circuit 37 is set. The output EN of the latch circuit 37 changes to a high level, and the switching element SW1 is turned on. Turn-off operation is the same as the second embodiment.

In a flyback power supply like the embodiment, as shown in FIG. 20, immediately after the switch is turned off, leakage inductance of the transformer and capacitive components of parts around the transformer occasionally gives the ringing RG to a drain voltage VD of the switching element SW1 and the voltage VGMD of the terminal DMG. This may result in false detection of the resonance detection circuit 31. However, the switching power control IC 13 of the modification is provided with an AND gate G5 which masks a ringing period immediately after rise of the voltage VDMG with an output signal of the delay circuit DLY. It prevents unintentional operation, such as false detection of the resonance detection circuit 31. The resonance detection circuit 31 may be provided with a circuit like the delay circuit DLY and the AND gate G5. Like the above, it provides effect of avoiding malfunction due to ringing of the voltage VDMG.

The power control IC 13 of the second embodiment described above operates only in the discontinuous current mode except when the voltage VDGM of the external terminal DMG is equal to or lower than the reference voltage VDMGREF2 during a demagnetization period (see FIG. 16). However, the power control IC 13 of the modification in FIG. 18 and FIG. 19 is provided with a delay circuit DLY, a flip-flop FF4, and an OR gate G6. Therefore, as can be seen in, for example, FIG. 20, operation in the continuous current mode is possible in conditions other than the above condition (VDGM<VDMGREF2). It brings advantage that the transformer and other parts are miniaturized and the cost is reduced.

Figure 21A:
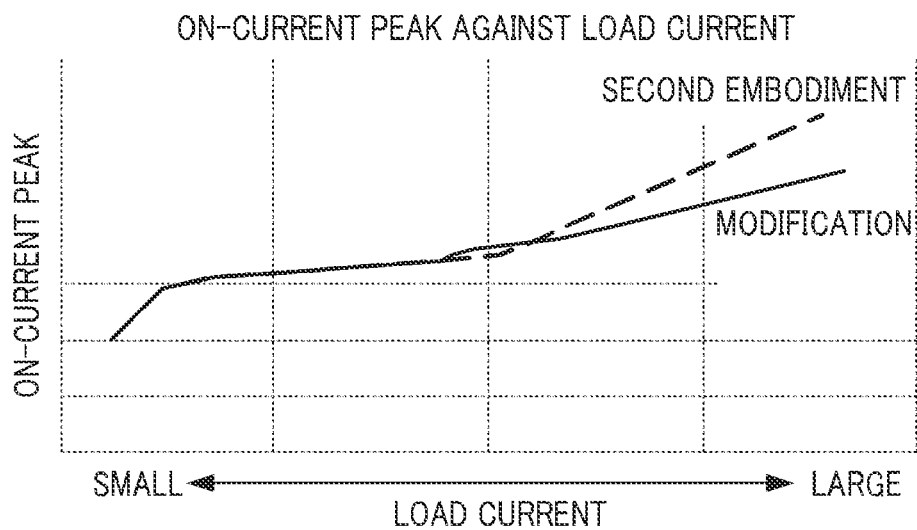
FIG. 21A is a graph showing characteristics of an on-current peak (a peak of a current flowing through a primary winding) in the semiconductor device according to the second embodiment and the modification in relation to a load current.
Figure 21B:
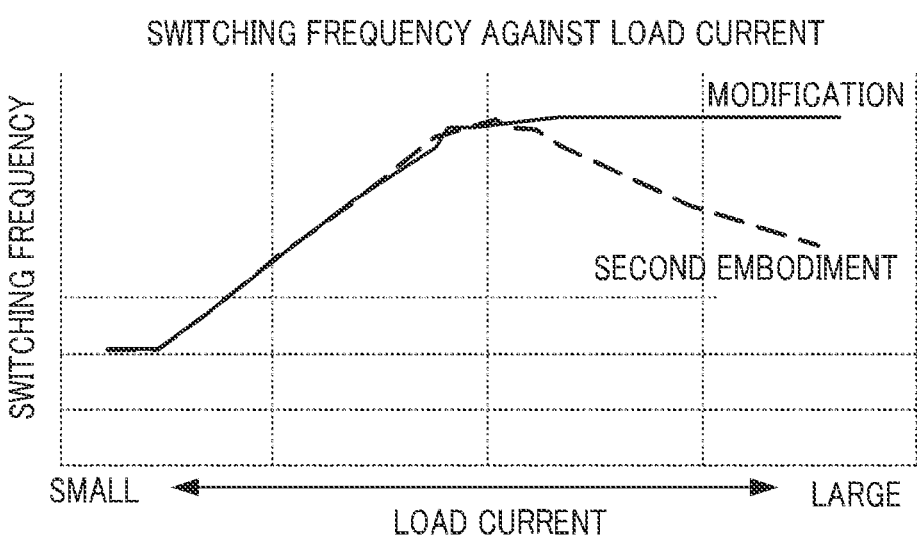
FIG. 21B is a graph showing characteristics of a switching frequency in the semiconductor device according to the second embodiment and the modification in relation to a load current output to a load.

FIGS. 21A and 21B illustrate characteristics of a peak of a current flowing through the primary winding for a load current and characteristics of switching frequency in the power control IC of the second embodiment and in the power control IC of the modification. In FIGS. 21A and 21B, the dashed line indicates characteristics of the power control IC of the second embodiment. The solid line indicates characteristics of the power control IC of the modification.

It is known from FIG. 21A that, even when a load current increases, increase of a peak of a current flowing through the primary winding is less in the power control IC of the modification. Therefore, the transformer of the power control IC of the modification is less likely to be saturated as compared with the transformer of the power control IC of the second embodiment. It brings advantage that the transformer is miniaturized and that inexpensive parts with a lower rated current can be used for the switching element SW1.

It is known from FIG. 21B that the switching frequency of the power control IC of the second embodiment decreases in a region where a load current is large while the switching frequency of the power control IC of the modification does not decrease in a region where a load current is large but keeps a high level. Therefore, a ripple of an output voltage of the power control IC is smaller in the modification than in the second embodiment. It brings advantage that an inexpensive capacitor having a small capacitance value, i.e. small size can be used as the output capacitor for a standard value of a predetermined output voltage ripple.

The invention made by the inventors has been specifically described based on embodiments. However, the present invention is not limited to those embodiments. For example, in the embodiments, a voltage obtained by dividing a voltage of the auxiliary winding with resistors R1, R2 as external elements is applied to the external terminal DMG. Alternatively, the voltage of the auxiliary winding may be applied directly to the external terminal DMG. Alternatively, a voltage divided by a resistor element provided within the power control IC, or a voltage divided by a resistor element provided within the power control IC and by an external resistor element may be applied to the external terminal DMG.

In the embodiments, the switching transistor SW1 and the current sense resistor Rs are elements separated from the power control IC 13. Alternatively, a switching transistor SW1 may be incorporated into the power control IC 13 so as to form one semiconductor integrated circuit (In this case, the current sense resistor Rs is an external element). Alternatively, the switching transistor SW1 and the current sensing resistor Rs may be incorporated into the power control IC 13. Instead of providing a current sense resistor Rs and generating the voltage Vcs for detection, a volume of a drain current may be detected from a drain voltage of the switching transistor SW1 therein.

The above embodiments show examples in which the present invention is applied to a switching power supply with a function of switching an output voltage. However, the present invention can also be applied to a switching power supply that does not have the function of switching an output voltage.

What is claimed is:

1. A resonance voltage attenuation detection circuit that detects attenuation of a resonance voltage of a winding of a transformer, the resonance voltage attenuation detection circuit comprising:
   a first voltage comparator circuit that compares a voltage of the winding with a predetermined first voltage; and
   a time-out circuit that performs clocking operation in accordance with an output of the first voltage comparator circuit,
   wherein the time-out circuit outputs an attenuation detection signal when the time-out circuit has clocked a preset period which is shorter than a time required for a peak voltage of the winding to be attenuated from the first voltage to a predetermined second voltage lower than the first voltage.

2. The resonance voltage attenuation detection circuit according to claim 1, wherein
   the time-out circuit comprises:
      a constant current source;
      a capacitance element that is charged by a current of the constant current source;
      a switch that discharges a charge of the capacitance element; and
      a second voltage comparator circuit that compares a voltage of the capacitance element with a predetermined voltage,
   the switch is turned on and off by the output of the first voltage comparator circuit, and
   the time-out circuit outputs an output signal of the second voltage comparator circuit as the attenuation detection signal.

3. A semiconductor device for a switching power which generates a drive signal that turns on and off a switching element connected in series with a primary winding of a transformer for voltage conversion which includes an auxiliary winding, the semiconductor device comprising:
   a resonance voltage attenuation detection circuit to which a voltage induced in the auxiliary winding is applied and which detects attenuation of a resonance voltage;
   a turn-on control circuit that generates a timing signal that turns on the switching element based on an attenuation detection signal output by the resonance voltage attenuation detection circuit; and
   a turn-off control circuit that generates a timing signal that turns off the switching element,
   wherein the semiconductor device is able to be operated in a quasi-resonance mode.

4. The semiconductor device according to claim 3, wherein
   the resonance voltage attenuation detection circuit comprises:
      a voltage comparator circuit that compares the voltage of the auxiliary winding with a predetermined first voltage; and
      a time-out circuit that performs clocking operation in accordance with an output of the voltage comparator circuit,
   the time-out circuit starts the clocking operation at a time point at which the voltage comparator circuit detects that a peak voltage of the auxiliary winding becomes lower than the first voltage, and
   the time-out circuit outputs an attenuation detection signal in a case in which a time required for the voltage of the auxiliary winding to fall from the first voltage to a predetermined second voltage lower than the first voltage is longer than a cycle of the resonance voltage and is shorter than a predetermined period.

5. A semiconductor device for a switching power which generates a drive signal that turns on and off a switching element connected in series with a primary winding of a transformer for voltage conversion which includes an auxiliary winding, the semiconductor device comprising:
   a first external terminal to which a feedback voltage corresponding to a voltage output from a secondary side of the transformer is applied;
   a second external terminal to which a voltage induced in the auxiliary winding is applied;
   a resonance detection circuit that detects resonance of the voltage of the auxiliary winding based on a voltage of the second external terminal;
   a resonance voltage attenuation detection circuit that detects attenuation of a resonance voltage of the auxiliary winding based on the voltage of the second external terminal;
   a turn-on control circuit that generates a timing signal that turns on the switching element based on a detection signal of the resonance detection circuit and on a detection signal of the resonance voltage attenuation detection circuit;
   a turn-off control circuit that generates a timing signal that turns off the switching element based on a voltage of the first external terminal and a voltage proportional to a current flowing through the switching element; and
   a drive pulse generation circuit that generates a pulse signal which is a source of the drive signal based on the signal output from the turn-on control circuit and on the signal output from the turn-off control circuit,
   wherein the turn-on control circuit generates a timing signal that turns on the switching element when resonance of the voltage of the auxiliary winding is around a bottom so that the semiconductor device is able to be operated in a quasi-resonance mode.

6. The semiconductor device according to claim 5, further comprising:
   a timer circuit that clocks a period corresponding to the voltage of the first external terminal,
   wherein
   the turn-on control circuit generates a timing signal that turns on the switching element based on the detection signal of the resonance detection circuit, the detection signal of the resonance voltage attenuation detection circuit, and an output signal of the timer circuit, and
   the turn-on control circuit controls the drive pulse generation circuit such that:
      in a case in which the resonance voltage attenuation detection circuit does not detect attenuation of the resonance voltage, the pulse signal rises at a time point at which the resonance detection circuit outputs the detection signal after an output of the timer circuit changes; and
      in a case in which the resonance voltage attenuation detection circuit detects attenuation of the resonance voltage, the pulse signal rises at a time point at which the output of the timer circuit changes.

7. The semiconductor device according to claim 6, wherein the resonance detection circuit includes a first voltage comparator circuit that compares the voltage of the second external terminal with a predetermined first voltage, the resonance detection circuit outputs a resonance detection signal in a case in which the voltage of the second external terminal becomes lower than the first voltage, the resonant voltage attenuation circuit comprises:
- a second voltage comparator circuit that compares the voltage of the second external terminal with a predetermined second voltage higher than the first voltage; and
- a clocking circuit that clocks a predetermined period shorter than a clocking period of the timer circuit, the clocking circuit begins clocking operation at a time point at which the second voltage comparator circuit detects that a peak voltage of the second external terminal becomes lower than the second voltage, the clocking circuit outputs an attenuation detection signal in a case in which a time required for the voltage of the second external terminal to fall from the second voltage to the first voltage is longer than a cycle of the resonance voltage and is shorter than a predetermined period expected in advance to be required for attenuation, and the turn-on control circuit controls the drive pulse generation circuit such that the pulse signal rises at a time point at which the timer circuit has clocked a predetermined clocking period in a case in which the attenuation detection signal is output before the timer circuit clocks a predetermined clocking period.

8. The semiconductor device according to claim 7, wherein the resonant voltage attenuation circuit comprises:
- a delay circuit that delays a signal output from the drive pulse generation circuit; and
- a logic circuit that prevents a detection signal from being supplied to the clocking circuit, the detection signal being output from the second voltage comparator circuit based on an output signal of the delay circuit.

9. The semiconductor device according to claim 7, wherein the resonance detection circuit comprises:
- a delay circuit that delays a signal output from the drive pulse generation circuit; and
- a logic circuit that temporarily prevents a detection signal from being output from the first voltage comparator circuit based on an output signal of the delay circuit.

10. The semiconductor device according to claim 8, wherein
the delay circuit delays a signal obtained by inverting the signal output from the drive pulse generation circuit, and
the resonant voltage attenuation circuit comprises:
- a latch circuit that receives the output signal of the delay circuit when the detection signal output from the second voltage comparator circuit falls; and
- a logic circuit that logically adds the output signal of the clocking circuit to an output signal of the latch circuit.

11. The semiconductor device according to claim 6, wherein the period clocked by the timer circuit is set in accordance with the voltage of the first external terminal such that:
the period is set at a longer time in a first case in which the voltage of the first external terminal is low, and
the period is set at a shorter time in a second case in which the voltage of the first external terminal is high.

12. A switching power supply comprising:
the semiconductor device according to claim 5;
a transformer which comprises an auxiliary winding and a primary winding to which a voltage obtained by rectifying an AC voltage is applied; and
a switching element connected to the primary winding, wherein
the semiconductor device controls the switching element to output a predetermined voltage to a side of a secondary winding, and
an output voltage on the side of the secondary winding is switched based on an external signal.

* * * * *